US012765172B2

(12) United States Patent
Mou et al.

(10) Patent No.: US 12,765,172 B2
(45) Date of Patent: Oct. 13, 2026

(54) DISPLAY SUBSTRATE WITH SUB-PIXELS AND DRIVING TRANSISTORS ARRANGED TO REDUCE DEGRADATION, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xin Mou, Beijing (CN); Yuhsiung Feng, Beijing (CN); Hongting Lu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/790,349

(22) PCT Filed: Jul. 20, 2021

(86) PCT No.: PCT/CN2021/107421

§ 371 (c)(1), (2) Date: Jun. 30, 2022

(87) PCT Pub. No.: WO2023/000174

PCT Pub. Date: Jan. 26, 2023

(65) Prior Publication Data

US 2024/0179945 A1 May 30, 2024

(51) Int. Cl.
*H10K 59/121* (2023.01)
*G02F 1/1343* (2006.01)
(Continued)

(52) U.S. Cl.
CPC ... *H10K 59/1213* (2023.02); *G02F 1/134309* (2013.01); *G02F 1/136286* (2013.01);
(Continued)

(58) Field of Classification Search
CPC ........... H10K 59/1213; H10K 59/1216; H10K 59/122; H10K 59/131; H10K 59/35;
(Continued)

(56) References Cited

U.S. PATENT DOCUMENTS

2005/0168135 A1 8/2005 Iga
2006/0267490 A1 11/2006 Hong et al.
(Continued)

FOREIGN PATENT DOCUMENTS

CN 1917228 A 2/2007
CN 102915693 A 2/2013
(Continued)

OTHER PUBLICATIONS

Chen; Hai-Jing, CN-111952342-A, Machine Translation (Year: 2020).*
(Continued)

*Primary Examiner* — Jacob Y Cho
*Assistant Examiner* — Grace Cha
(74) *Attorney, Agent, or Firm* — IPro, PLLC

(57) ABSTRACT

The present application provides a display substrate, a display panel and a display device. An orthographic projection of the pixel opening of the first color sub-pixel of the display substrate on the base substrate, an orthographic projection of the pixel opening of the second color sub-pixel on the base substrate, and an orthographic projection of the pixel opening of the third color sub-pixel on the base substrate all have no overlap with the orthographic projections of the channel of the driving transistors thereof on the base substrate respectively. Alternatively, an orthographic projection of the pixel opening of at least one sub-pixel on
(Continued)

the base substrate has overlap with an orthographic projection of the channel of the driving transistor thereof on the base substrate, an orthographic projection of the pixel opening of at least one of the second color sub-pixels in a first direction has overlap with an orthographic projection of the pixel opening of the first color sub-pixel in the first direction and an orthographic projection of the pixel opening of the third color sub-pixel in the first direction, and the orthographic projection of the pixel opening of the second color sub-pixel in a second direction has no overlap with either an orthographic projection of the pixel opening of the first color sub-pixel in the second direction or an orthographic projection of the pixel opening of the third color sub-pixel in the second direction, where the first direction intersects with the second direction.

20 Claims, 11 Drawing Sheets

(51) Int. Cl.
*G02F 1/1362* (2006.01)
*G02F 1/1368* (2006.01)
*H10K 59/122* (2023.01)
*H10K 59/131* (2023.01)
*H10K 59/35* (2023.01)

(52) U.S. Cl.
CPC ....... *G02F 1/1368* (2013.01); *H10K 59/1216* (2023.02); *H10K 59/122* (2023.02); *H10K 59/131* (2023.02); *H10K 59/35* (2023.02)

(58) Field of Classification Search
CPC .................. H10K 59/121; H10K 59/80; G02F 1/134309; G02F 1/136286; G02F 1/1368; G02F 1/1335; G02F 1/1347
See application file for complete search history.

(56) References Cited

U.S. PATENT DOCUMENTS

2014/0043372 A1 2/2014 Xi et al.
2014/0312333 A1 10/2014 Chaji et al.
2016/0181341 A1* 6/2016 Lee ...................... H10D 86/421 257/40
2017/0025487 A1 1/2017 Byun et al.
2017/0148366 A1* 5/2017 Hsin .................... H10K 59/122
2018/0175120 A1 6/2018 Hsin et al.
2018/0261663 A1 9/2018 Li et al.
2019/0114459 A1 4/2019 Ma et al.
2019/0129549 A1* 5/2019 Yeh ....................... G02F 1/1368
2019/0131372 A1 5/2019 Toyomura et al.
2019/0214440 A1 7/2019 Lee et al.
2020/0057330 A1 2/2020 Yamazaki et al.
2020/0098841 A1 3/2020 Song et al.
2020/0211477 A1* 7/2020 Lai ....................... G09G 3/3258
2021/0013455 A1 1/2021 Bae et al.
2021/0167161 A1* 6/2021 Yang .................... G09G 3/3275
2021/0356761 A1 11/2021 Li et al.
2022/0223673 A1 7/2022 Xu et al.
2022/0367596 A1 11/2022 Chen et al.
2024/0298498 A1 9/2024 Cao et al.

FOREIGN PATENT DOCUMENTS

CN 104716167 A 6/2015
CN 104966728 A 10/2015
CN 105789266 A 7/2016
CN 107579099 A 1/2018
CN 108922469 A 11/2018
CN 208173203 U * 11/2018 ........... G09G 3/3233
CN 109074768 A 12/2018
CN 109273498 A 1/2019
CN 109301088 A 2/2019
CN 109581704 A 4/2019
CN 110047383 A 7/2019
CN 111326636 A 6/2020
CN 111508977 A 8/2020
CN 111833754 A 10/2020
CN 111952342 A * 11/2020 ......... H01L 27/3216
CN 111969032 A 11/2020
CN 111999948 A 11/2020
JP 2006189475 A 7/2006
KR 20100046439 A 5/2010
KR 20170012767 A 2/2017
KR 20200117293 A 10/2020
KR 20210068330 A 6/2021
WO 2020124693 A1 6/2020

OTHER PUBLICATIONS

Xu; Chen, CN-208173203-U, Machine Translation (Year: 2018).*
PCT/CN2022/106878 international search report.
PCT/CN2022/106878 Written Opinion.
PCT/CN2021/107421 Written Opinion.
PCT/CN2021/107421 international search report.
IN202347060417 first office action dated Sep. 23, 2025.
U.S. Appl. No. 18/580,934 non-final office action dated Jan. 27, 2026.

* cited by examiner

DISPLAY SUBSTRATE WITH SUB-PIXELS AND DRIVING TRANSISTORS ARRANGED TO REDUCE DEGRADATION, DISPLAY PANEL AND DISPLAY DEVICE

CROSS-REFERENCE TO RELATED APPLICATIONS

The present application is a U.S. National Phase of International Application No. PCT/CN2021/107421, entitled "DISPLAY SUBSTRATE, DISPLAY PANEL AND DISPLAY DEVICE", and filed on Jul. 20, 2021. The entire contents of each of the above-listed applications are hereby incorporated by reference for all purposes.

TECHNICAL FIELD

The present application relates to the field of display technology, and in particular, to a display substrate, a display panel and a display device.

BACKGROUND

Organic light emitting diodes have advantages of self-luminescence, high efficiency, bright colors, light weight, power saving, and wide operating temperature range, etc., and have been gradually applied in fields of large-area display, lighting, and vehicle-mounted display.

SUMMARY

According to a first aspect of examples of the present disclosure, there is provided a display substrate, including a base substrate and a plurality of sub-pixels disposed on the base substrate;

the plurality of sub-pixels includes a plurality of first color sub-pixels, a plurality of second color sub-pixels and a plurality of third color sub-pixels, human eyes are more sensitive to the first color than to the third color, and human eyes are more sensitive to the third color than to the second color; the sub-pixel includes an organic light emitting element and a pixel circuit for driving the organic light emitting element; the organic light emitting element includes a first electrode, a second electrode, and an organic light emitting material disposed between the first electrode and the second electrode; the first electrode of the sub-pixel is electrically connected to the pixel circuit; the pixel circuit includes a driving transistor;

the display substrate further includes an active semiconductor layer and a pixel defining layer, the active semiconductor layer includes channels and source and drain regions of the driving transistors of the sub-pixels; the pixel defining layer is provided with pixel openings corresponding to the sub-pixels one to one;

an orthographic projection of the pixel opening of the first color sub-pixel on the base substrate has no overlap with an orthographic projection of the channel of the driving transistor of the first color sub-pixel on the base substrate, an orthographic projection of the pixel opening of the second color sub-pixel on the base substrate has no overlap with an orthographic projection of the channel of the driving transistor of the second color sub-pixel on the base substrate, an orthographic projection of the pixel opening of the third color sub-pixel on the base substrate has no overlap with an orthographic projection of the channel of the driving transistor of the third color sub-pixel on the base substrate; or, an orthographic projection of the pixel opening of at least one sub-pixel on the base substrate has overlap with an orthographic projection of the channel of the driving transistor thereof on the base substrate, an orthographic projection of the pixel opening of at least one of the second color sub-pixels in a first direction has overlap with an orthographic projection of the pixel opening of the first color sub-pixel in the first direction and an orthographic projection of the pixel opening of the third color sub-pixel in the first direction, and the orthographic projection of the pixel opening of the second color sub-pixel in a second direction has no overlap with either an orthographic projection of the pixel opening of the first color sub-pixel in the second direction or an orthographic projection of the pixel opening of the third color sub-pixel in the second direction, where the first direction intersects with the second direction.

In an example, the orthographic projection of the pixel opening of the first color sub-pixel on the base substrate has overlap with the orthographic projection of the channel of the driving transistor of the first color sub-pixel on the base substrate, the orthographic projection of the pixel opening of the second color sub-pixel on the base substrate has overlap with the orthographic projection of the channel of the driving transistor of the second color sub-pixel on the base substrate, and the orthographic projection of the pixel opening of the third color sub-pixel on the base substrate has overlap with the orthographic projection of the channel of the driving transistor of the third color sub-pixel on the base substrate.

In an example, the plurality of sub-pixels are divided into a plurality of pixel groups, and each of the pixel groups includes a first color sub-pixel, a second color sub-pixel and a third color sub-pixel; at least one of the pixel groups includes two rows of sub-pixels arranged along the first direction, wherein one row of sub-pixels arranged along the first direction includes first color sub-pixels and third color sub-pixels which are alternately arranged, and the other row of sub-pixels arranged along the first direction includes second color sub-pixels.

In an example, in at least one of the pixel groups, the orthographic projection of the pixel opening corresponding to each of the sub-pixels on the base substrate has no overlap with an orthographic projection of the gate electrode of the driving transistor of any one of the sub-pixels on the base substrate, or the orthographic projection of the pixel opening corresponding to each of the sub-pixels on the base substrate has an overlapping region with the orthographic projection of the gate electrode of the driving transistor of any one of the sub-pixels on the base substrate, and a ratio of an area of the overlapping region to an area of the gate electrode is not more than 10%.

In an example, the display substrate is further provided with a plurality of scan signal lines extending along the first direction, the scan signal lines being configured to provide scan signals for the pixel groups;

in at least one pixel group, in the second direction, a distance from the channel of the driving transistor of the second color sub-pixel to the scan signal line is different from a distance from the channel of the driving transistor of the first color sub-pixel to the scan signal line.

In an example, in at least one pixel group, in the second direction, the distance from the channel of the driving transistor of the second color sub-pixel to the scan signal line is longer than the distance from the channel of the driving transistor of the first color sub-pixel to the scan signal line.

In an example, the display substrate is further provided with scan signal lines extending along the first direction, the scan signal lines being configured to provide scan signals for the pixel groups;

in at least one pixel group, an orthographic projection of the scan signal line in the second direction has overlap with an orthographic projection of the gate electrode of the driving transistor of the sub-pixel in the second direction, where the second direction is perpendicular to the first direction.

In an example, the display substrate is further provided with scan signal lines extending along the first direction, the scan signal lines being configured to provide scan signals for the pixel groups; the scan signal line includes a main body portion of the scan signal line and a protruding portion protruding from one side of the main body portion of the scan signal line; the main body portion of the scan signal line includes a first scan sub-line, a second scan sub-line and a connection part, the first scan sub-line is connected to the second scan sub-line through the connection part, the first scan sub-line is connected to the pixel circuit of the first color sub-pixel, the second scan sub-line is connected to the pixel circuit of the second color sub-pixel, and extension direction of part of the connection part intersects with the extension direction of the first scan sub-line;

the pixel circuit includes a compensation transistor, and the compensation transistor includes a first gate electrode and a second gate electrode; in the compensation transistor, the first gate electrode is a part of the connection part that overlaps with an orthographic projection of the active semiconductor layer on the base substrate, and the second gate electrode is a part of the protruding portion that overlaps the orthographic projection of the active semiconductor layer on the base substrate.

In an example, the connection part includes a first connection sub-part, a second connection sub-part and a third connection sub-part which are connected in sequence, extension direction of the first connection sub-part and the third connection sub-part intersect with extension direction of the first scan sub-line, and extension direction of the second connection sub-part is the same as the extension direction of the first scan sub-line;

the first gate electrode is a part of the second connection sub-part that overlaps with the orthographic projection of the active semiconductor layer on the base substrate.

In an example, the active semiconductor layer includes a first section, a second section, a third section and a fourth section which are connected in sequence; the second section, the fourth section and the main body portion of the scan signal line extend along the first direction, the first section and the third section extend in the second direction, where the second direction intersects with the first direction; the display substrate further includes a reset control signal line extending along the first direction and disposed in the same layer as the scan signal line; the pixel circuit includes a reset transistor, and the reset transistor includes a gate electrode;

the second gate electrode is a part of the protruding portion that overlaps with an orthographic projection of the fourth section on the base substrate, the gate electrode of the reset transistor includes a part of the reset control signal line that overlaps an orthographic projection of the first section on the base substrate.

In an example, the pixel circuit further includes a threshold compensation transistor, the threshold compensation transistor includes a gate electrode; the display substrate further includes a connection structure, one end of the connection structure is connected to the gate electrode of the driving transistor, and the other end of the connection structure is connected to source and drain regions of the threshold compensation transistor;

the connection structure includes a first portion and a second portion connected to the first portion, an orthographic projection of the first portion on the base substrate and an orthographic projection of the protruding part on the base substrate are disposed at are located on the same side of an orthographic projection of the main body portion of the scan signal line on the base substrate; a length of the first portion in the second direction is larger than a length of the protruding portion in the second direction.

In an example, a size of the connection structure in the second direction ranges from 35 μm to 70 μm.

In an example, the display substrate is further provided with a plurality of scan signal lines and reset control signal lines extending along the first direction, the scan signal lines being configured to provide scan signals for the pixel groups, the reset control signal lines being configured to provide reset control signals for the pixel groups;

an orthographic projection of the first electrode of at least one of the second color sub-pixels on the base substrate has overlap with an orthographic projection of the reset control signal line on the base substrate and an orthographic projection of the scan signal line on the base substrate.

In an example, any one of the orthographic projection of the pixel opening of the first color sub-pixel on the base substrate, the orthographic projection of the pixel opening of the second color sub-pixel on the base substrate or the orthographic projection of the pixel opening of the third color sub-pixel on the base substrate has no overlap with any one of the orthographic projection of the channel of the driving transistor of the first color sub-pixel on the base substrate, the orthographic projection of the channel of the driving transistor of the second color sub-pixel on the base substrate, or the orthographic projection of the channel of the driving transistor of the third color sub-pixel on the base substrate.

In an example, the display substrate is further provided with scan signal lines, the scan signal lines being configured to provide scan signals for the pixel groups; a distance between the channel of the driving transistor of the sub-pixel and the scan signal line in the second direction ranges from 1 μm to 50 μm.

In an example, the pixel circuit further includes a capacitor, and the capacitor includes a first polar plate and a second polar plate disposed on a side of the first polar plate away from the base substrate; an area of the second polar plate of the second color sub-pixel is larger than an area of the second polar plate of the first color sub-pixel, and the area of the second polar plate of the second color sub-pixel is larger than an area of the second polar plate of the third color sub-pixel.

In an example, the display substrate further includes a first power supply line and a second power supply line disposed on a side of the first power supply line away from the base substrate; the first power supply line and the second power supply line are configured to provide a power supply signal for the pixel circuit; the first power supply line is electrically connected to the second power supply line;

the second power supply line includes a first power supply sub-line extending along the first direction and a second power supply sub-line extending along the second direction, the first power supply sub-line intersects with the second power supply sub-line.

In an example, the pixel circuit further includes an emission control transistor and an electrode connection structure, and the electrode connection structure electrically connects the first electrode of the sub-pixel to source and drain regions of the emission control transistor;

areas of the electrode connection structures of at least two of the sub-pixels are different.

In an example, the electrode connection structure at least includes a first electrode connection sub-structure and a second electrode connection sub-structure on a side of the first electrode connection sub-structure away from the base substrate; areas of the first electrode connection sub-structure and/or the second electrode connection sub-structure of at least two of the sub-pixels are different.

In an example, the display substrate further includes a shielding line and a reset power supply signal line, the reset power supply signal line being configured to provide a reset power signal for the sub-pixels; the shielding line is electrically connected to the reset power signal line.

In an example, a size of the first color sub-pixel in the first direction ranges from 35 μm to 110 μm, and a size of the first color sub-pixel in the second direction ranges from 20 μm to 60 μm; a size of the second color sub-pixel in the first direction ranges from 35 μm to 120 μm, and a size of the second color sub-pixel in the second direction ranges from 20 μm to 80 μm; a size of the third color sub-pixel in the first direction ranges from 35 μm to 70 μm, and a size of the third color sub-pixel in the second direction ranges from 20 μm to 60 μm According to a second aspect of examples of the present disclosure, there is provided a display panel, including the display substrate described above.

According to a third aspect of examples of the present disclosure, there is provided a display device, including the display panel described above.

DETAILED DESCRIPTION OF THE EMBODIMENTS

Figure 1:
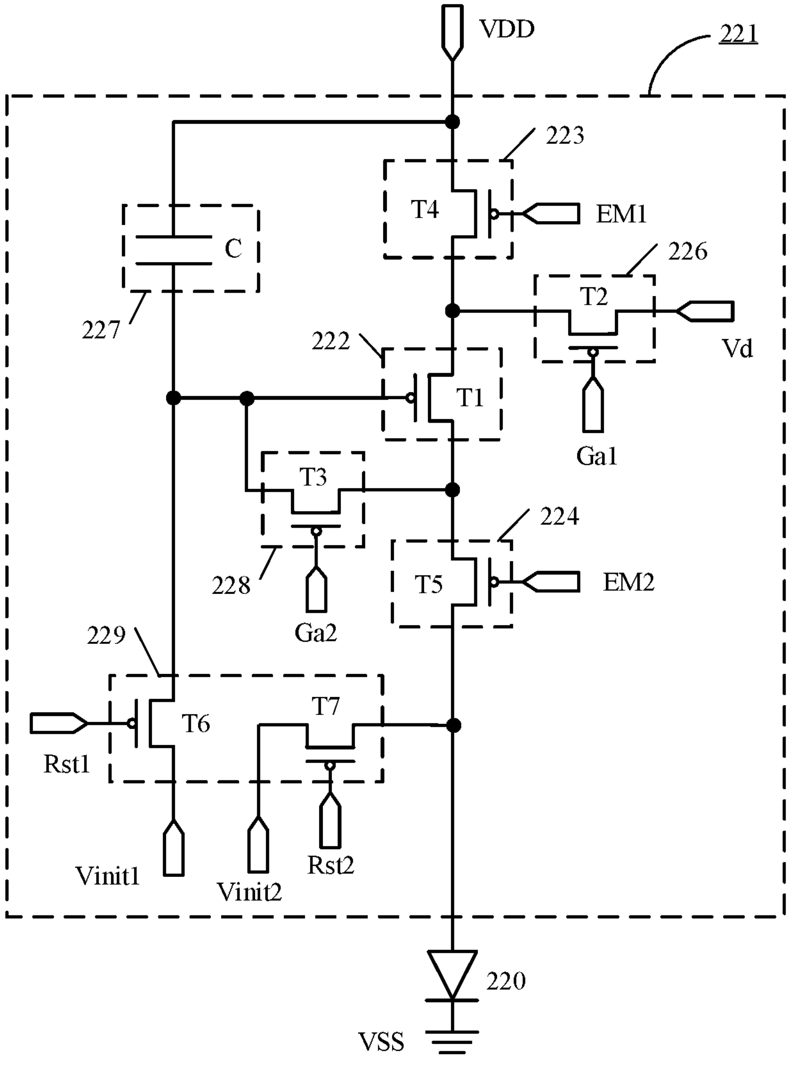
FIG. 1 is a schematic circuit diagram of a pixel circuit provided by an example of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein is and includes any and all possible combinations of one or more of the associated listed items.

It is to be understood that, although terms "first," "second," "third," and the like can be used in the present disclosure to describe various information, such information should not be limited to these terms. These terms are only used to distinguish one category of information from another. For example, without departing from the scope of the present disclosure, first information can be referred as second information; and similarly, second information can also be referred as first information. Depending on the context, the word "if" as used herein can be interpreted as "when" or "upon" or "in response to determining".

Embodiments of the present application provide a display substrate, a display panel, and a display device. The display substrate, the display panel and the display device in the embodiments of the present application will be described in detail below with reference to the accompanying drawings. The features of the embodiments described below can complement each other or be combined with each other without conflict.

Embodiments of the present application provide a display substrate, a display panel, and a display device. The display substrate, the display panel and the display device in the embodiments of the present application will be described in detail below with reference to the accompanying drawings. The features of the embodiments described below can complement each other or be combined with each other without conflict.

An embodiment of the present application provides a display substrate. The display substrate includes a base substrate and a plurality of sub-pixels disposed on the base substrate. The plurality of sub-pixels are arranged at intervals on the base substrate.

The plurality of sub-pixels include a plurality of first color sub-pixels, a plurality of second color sub-pixels, and a plurality of third color sub-pixels, and human eyes are more sensitive to the first color than to the third color, and more sensitive to the third color than to the second color. The color of the sub-pixel refers to a color of light emitted by the sub-pixel. In some embodiments, the first color is green, the second color is blue, and the third color is red.

The sub-pixel includes an organic light emitting element and a pixel circuit for driving the organic light emitting element. The organic light emitting element includes a first electrode, a second electrode, and an organic light emitting material disposed between the first electrode and the second electrode. The first electrode of the sub-pixel is electrically connected to the pixel circuit. In some embodiments, the first electrode can be an anode and the second electrode can be a cathode.

In one embodiment, the display substrate further includes a pixel defining layer, and the pixel defining layer is provided with pixel openings corresponding to the sub-pixels one to one. The pixel defining layer is disposed between adjacent sub-pixels, and the pixel openings are used to define light emitting regions of the sub-pixels of the colors. An orthographic projection of the pixel opening of the pixel defining layer on the base substrate is located within an orthographic projection of the first electrode of the corresponding sub-pixel on the base substrate.

In some embodiments, the organic light emitting material is disposed on a side of the first electrode away from the base substrate. The first electrode of the sub-pixel of a color is in contact with the organic light emitting material at the pixel opening of the pixel defining layer, and the pixel opening of the pixel defining layer defines the shape of the light emitting region of the sub-pixel. For example, the first electrode (e.g., the anode) of the organic light emitting element can be disposed under the pixel defining layer, and the pixel opening of the pixel defining layer exposes a part of the first electrode. When the organic light emitting material is formed in the pixel opening in the pixel defining layer, the organic light emitting material is in contact with the first electrode, so that this part of the first electrode can drive the organic light emitting material to emit light.

In some embodiments, an orthographic projection of the pixel opening of the pixel defining layer on the base substrate is located within an orthographic projection of the corresponding organic light emitting material on the base substrate. That is, the organic light emitting material covers the pixel opening of the pixel defining layer. For example, an area of the organic light emitting material is larger than an area of the corresponding pixel opening. That is, the organic light emitting material includes at least a part of the solid structure covering the pixel defining layer in addition to a part inside the pixel opening. Generally, the solid structures of the pixel defining layers at boundaries of the pixel openings are all covered with organic light emitting materials. It should be noted that the above description of the pattern of the organic light emitting material is based on the patterned organic light emitting materials of the sub-pixels formed by, for example, a FMM process. Apart from FMM production process, in some cases, organic light emitting material forms an integral film layer in the entire display area by an open mask process, having a continuous orthographic projection on the base substrate, in which case, the organic light emitting material must have a part located in the pixel opening and a part on the solid structure of the pixel defining layer.

In one embodiment, the plurality of sub-pixels are divided into a plurality of pixel groups, and the organic light emitting elements of the plurality of pixel groups are arranged on the base substrate along a first direction and a second direction, and the first direction and the second direction intersect with each other. The pixel groups include sub-pixels of a first color, sub-pixels of a second color, and sub-pixels of a third color. In some embodiments, the first direction and the second direction are perpendicular to each other. In some embodiments, the first direction is the row direction and the second direction is the column direction. In some embodiments, the pixel circuits of the sub-pixels in each of the pixel groups are arranged at intervals in the first direction.

In one embodiment, the area covered by the orthographic projection of the pixel circuit of the sub-pixel on the base substrate is approximately located within a rectangular box. The orthographic projection of the pixel circuit on the base substrate mainly includes the orthographic projections of the structures of various transistors, capacitors and other elements on the base substrate. The display substrate further includes a plurality of signal lines, and the signal lines are used to drive the pixel circuits. It should be noted that some signal lines include a portion inside the rectangular box and a portion extending outside the rectangular box. The pixel circuit further includes an electrode connection structure, and the electrode connection structure electrically connects the pixel circuit of the sub-pixel to the first electrode.

In one embodiment, as shown in FIG. 1, the pixel circuit 221 includes a driver circuit 222. The driving circuit 222 includes a control terminal, a first terminal and a second terminal, and is configured to provide to the organic light emitting element 220 a driving current for driving the organic light emitting element 220 to emit light.

In one embodiment, as shown in FIG. 1, the pixel circuit 221 includes a first light emitting control circuit 223 and a second light emitting control circuit 224. For example, the first light emitting control circuit 223 is connected to a first terminal of the driving circuit 222 and a first voltage terminal VDD, and is configured to turn on or off the connection between the driving circuit 222 and the first voltage terminal VDD. The second light emitting control circuit 224 is connected to a second terminal f the driving circuit 222 and the first electrode of the organic light emitting element 220, and is configured to turn on or off the connection between the driving circuit 222 and the organic light emitting element 220.

In one embodiment, as shown in FIG. 1, the pixel circuit 221 further includes a data writing circuit 226, a storage circuit 227, a threshold compensation circuit 228 and a reset circuit 229. The data writing circuit 226 is electrically connected to the first terminal of the driving circuit 222 and is configured to write a data signal into the storage circuit 227 under the control of a scan signal. The storage circuit 227 is electrically connected to a control terminal of the driving circuit 222 and the first voltage terminal VDD, and is configured to store a data signal. The threshold compensation circuit 228 is electrically connected to the control terminal and the second terminal of the driving circuit 222 and is configured to perform threshold compensation on the driving circuit 222. The reset circuit 229 is electrically connected to the control terminal of the driving circuit 222 and the first electrode of the organic light emitting element 220, and is configured to reset the control terminal of the driving circuit 222 and the first electrode of the organic light emitting element 220 under the control of a reset control signal.

In one embodiment, as shown in FIG. 1, the driving circuit 222 includes a driving transistor T1, the control terminal of the driving circuit 222 includes a gate electrode of the driving transistor T1, the first terminal of the driving circuit 222 includes a first electrode of the driving transistor T1, and the second terminal of the driving circuit 222 includes the second electrode of the driving transistor T1.

In one embodiment, as shown in FIG. 1, the data writing circuit 226 includes a data writing transistor T2. The storage circuit 227 includes a capacitor C. The threshold compensation circuit 228 includes a threshold compensation transistor T3. The first light emitting control circuit 223 includes a first light emitting control transistor T4. The second light emitting control circuit 224 includes a second light emitting control transistor T5. The reset circuit 229 includes a first reset transistor T6 and a second reset transistor T7. The reset control signal can include a first reset control sub-signal and a second reset control sub-signal.

In one embodiment, as shown in FIG. 1, a first electrode of the data writing transistor T2 is electrically connected to the first electrode of the driving transistor T1, and a second electrode of the data writing transistor T2 is configured to be electrically connected to a data line Vd to receive a data signal. A gate electrode of the data writing transistor T2 is configured to be electrically connected to a scan signal line Ga1 to receive a scan signal. A first electrode of the capacitor C is electrically connected to a first power supply terminal VDD, and a second electrode of the capacitor C is electrically connected to a gate electrode of the driving transistor T1. A first electrode of the threshold compensation transistor T3 is electrically connected to the second electrode of the driving transistor T1, a second electrode of the threshold compensation transistor T3 is electrically connected to the gate electrode of the driving transistor T1, and a gate electrode of the threshold compensation transistor T3 is configured to be electrically connected to a scan signal line Ga2 to receive a compensation control signal. A first electrode of the first reset transistor T6 is configured to be electrically connected to a reset power supply terminal Vinit1 to receive a first reset signal, a second electrode of the first reset transistor T6 is electrically connected to the gate electrode of the driving transistor T1, and a gate electrode of the first reset transistor T6 is configured to be electrically connected to a reset control signal line Rst1 to receive a first reset control sub-signal. A first electrode of the second reset transistor T7 is configured to be electrically connected to a reset power supply terminal Vinit2 to receive a second reset signal, a second electrode of the second reset transistor T7 is electrically connected to the first electrode of the organic light emitting element 220, and a gate electrode of the second reset transistor T7 is configured to be electrically connected to a reset control signal line Rst2 to receive a second reset control sub-signal. A first electrode of the first light emitting control transistor T4 is electrically connected to the first power supply terminal VDD, and ae second electrode of the first light emitting control transistor T4 is electrically connected to the first electrode of the driving transistor T1. A gate electrode of the first light emitting control transistor T4 is configured to be electrically connected to a light emitting control signal line EM1 to receive a first light emitting control signal. A first electrode of the second light emitting control transistor T5 is electrically connected to the second electrode of the driving transistor T1, a second electrode of the second light emitting control transistor T5 is electrically connected to the second electrode of the organic light emitting element 220, and a gate electrode of the second light emitting control transistor T5 is configured to be electrically connected to a light emitting control signal line EM2 to receive a second light emitting control signal. The first electrode of the organic light emitting element 220 is electrically connected to a second power supply terminal VSS.

In one embodiment, one of the first power supply terminal VDD and the second power supply terminal VSS is a high voltage terminal, and the other is a low voltage terminal. In the embodiment shown in FIG. 1, the first power supply terminal VDD is a voltage source to output a constant first voltage, and the first voltage is a positive voltage; and the second power supply terminal VSS can be a voltage source to output a constant second voltage, and the second voltage is a negative voltage, and so on. In some examples, the second power supply terminal VSS can be grounded.

In one embodiment, as shown in FIG. 1, the scan signal and the compensation control signal can be the same signal. That is, the gate electrode of the data writing transistor T2 and the gate electrode of the threshold compensation transistor T3 can be electrically connected to the same signal line. For example, the scan signal line Ga1 is used to receive the same signal (e.g., a scan signal). In this case, the display substrate 1000 can omit the scan signal line Ga2 to reduce the number of signal lines. For another example, the gate electrode of the data writing transistor T2 and the gate electrode of the threshold compensation transistor T3 can also be electrically connected to different signal lines respectively. That is, the gate electrode of the data writing transistor T2 is electrically connected to the scan signal line Ga1, and the gate electrode of the threshold compensation transistor T3 is electrically connected to the scan signal line Ga2, and the scan signal line Ga1 and the scan signal line Ga2 transmit the same signal.

It should be noted that the scan signal and the compensation control signal can also be different signals, so that the gate electrode of the data writing transistor T2 and the threshold compensation transistor T3 can be controlled separately and independently, increasing the flexibility of controlling the pixel circuit.

In one embodiment, as shown in FIG. 1, the first lighting control signal and the second lighting control signal can be the same signal. That is, the gate electrode of the first lighting control transistor T4 and the gate electrode of the second lighting control transistor T5 can be electrically connected to the same signal line, such as the light emitting control signal line EM1, to receive the same signal (for example, the first light emitting control signal). In this case, the display substrate 1000 can omit the light emission control signal line EM2, thereby reducing the number of signal lines. In other embodiments, the gate electrode of the first light emitting control transistor T4 and the gate electrode of the second light emitting control transistor T5 can also be electrically connected to different signal lines respectively. That is, the gate electrode of the first light emitting control transistor T4 is electrically connected to the light emitting control signal line EM1 and the gate electrode of the second light emitting control transistor T5 is electrically connected to the light emitting control signal line EM2, and the light emitting control signal line EM1 and the light emitting control signal line EM2 transmit the same signal.

It should be noted that when the first light emitting control transistor T4 and the second light emitting control transistor T5 are different types of transistors, for example, the first light emitting control transistor T4 is a P-type transistor, and the second light emitting control transistor T5 is an N-type transistor, the first light emitting control signal and the second light emitting control signal can also be different signals, which is not limited in the embodiments of the present application.

In one embodiment, the first reset control sub-signal and the second reset control sub-signal can be the same signal. That is, the gate electrode of the first reset transistor T6 and the gate electrode of the second reset transistor T7 can be electrically connected to the same signal line, such as the reset control signal line Rst1, to receive the same signal (for example, the first reset control sub-signal). In this case, the display substrate 1000 can omit the reset control signal line Rst2 to reduce the number of signal lines. For another example, the gate electrode of the first reset transistor T6 and the gate electrode of the second reset transistor T7 can also be electrically connected to different signal lines respectively. That is, the gate electrode of the first reset transistor T6 is electrically connected to the reset control signal line Rst1, and the gate electrodes of the second reset transistor T7 is electrically connected to the reset control signal line Rst2, and the reset control signal line Rst1 and the reset control signal line Rst2 transmit the same signal. It should be noted that the first reset control sub-signal and the second reset control sub-signal can also be different signals. In another embodiment, the first reset control sub-signal is different from the second reset control sub-signal, the pulse width of the reset control signal line Rst2 is larger than the pulse width of the reset control signal line Rst1, and the pulse width of the reset control signal line Rst2 is smaller than the pulse width of the light emitting control signal line EM2 when the second light emitting control transistor T5 is turned off. In this way, the lifetime of the organic light emitting element of the sub-pixel can be improved.

In one embodiment, the second reset control sub-signal can be the same as the scan signal. That is, the gate electrode of the second reset transistor T7 can be electrically connected to the scan signal line Ga1 to receive the scan signal as the second reset control sub-signal.

In one embodiment, the gate electrode of the first reset transistor T6 and the source electrode of the second reset transistor T7 are connected to the first reset power supply terminal Vinit1 and the second reset power supply terminal Vinit2, respectively, and the first reset power supply terminal Vinit1 and the second reset power supply terminal Vinit2 can be a DC reference voltage terminal to output a constant DC reference voltage. The first reset power supply terminal Vinit1 and the second reset power supply terminal Vinit2 can be the same signal, for example, the gate electrode of the first reset transistor T6 and the source electrode of the second reset transistor T7 are connected to the same reset power supply terminal. The first reset power supply terminal Vinit1 and the second reset power supply terminal Vinit2 can be high voltage terminals or low voltage terminals, as long as they can provide the first reset signal and the second reset signal to the gate electrode of the driving transistor T1 and the first electrode of the light emitting element 220 for reset, which is not limited in this application.

It should be noted that the driving circuit 222, the data writing circuit 226, the storage circuit 227, the threshold compensation circuit 228 and the reset circuit 229 in the pixel circuit shown in FIG. 1 are only for illustration, and the specific structures of the writing circuit 226, the storage circuit 227, the threshold compensation circuit 228, and the reset circuit 229 can be provided according to actual application requirements, which are not specifically limited in the embodiments of the present application.

According to the characteristics of transistors, transistors can be divided into N-type transistors and P-type transistors. For the sake of clarity, the embodiments of the present application describe the present application in detail by taking the transistors as P-type transistors (e.g., P-type MOS transistors) as an example. That is, in the description of this application, the driving transistor T1, the data writing transistor T2, the threshold compensation transistor T3, the first light emitting control transistor T4, the second light emitting control transistor T5, the first reset transistor T6 and the second reset transistor T7 and the like can all be P-type transistors. However, the transistors in the embodiments of the present application are not limited to P-type transistors. Those skilled in the art can also use N-type transistors (e.g., N-type MOS transistors) to implement the functions of one or more transistors in the embodiments of the present application according to actual needs.

It should be noted that the transistors used in the embodiments of the present application can be thin film transistors or field effect transistors or other switching devices with the same characteristics, and the thin film transistors can include oxide semiconductor thin film transistors, amorphous silicon thin film transistors or polysilicon thin film transistors, etc. The source and drain electrodes of the transistor can be symmetrical in structure, so the source and drain electrodes of the transistor can be indistinguishable in physical structure. In the embodiments of the present application, in order to distinguish the transistors, except for the gate electrodes serving as the control electrodes, one of the source and drain electrodes is simply referred to as the first electrode and the other as the second electrode. Therefore, in the embodiments of the present application, the first and second electrodes of all or some of the transistors are interchangeable as required.

It should be noted that, in the embodiment of the present application, the pixel circuit of the sub-pixel can be a 7T1C (that is, seven transistors and one capacitor) structure shown in FIG. 1, and can also include other numbers of transistors, such as a 7T2C structure, a 6T1C structure, a 6T2C structure, or a 9T2C structure, which is not limited in this embodiment of the present application.

Figure 2:
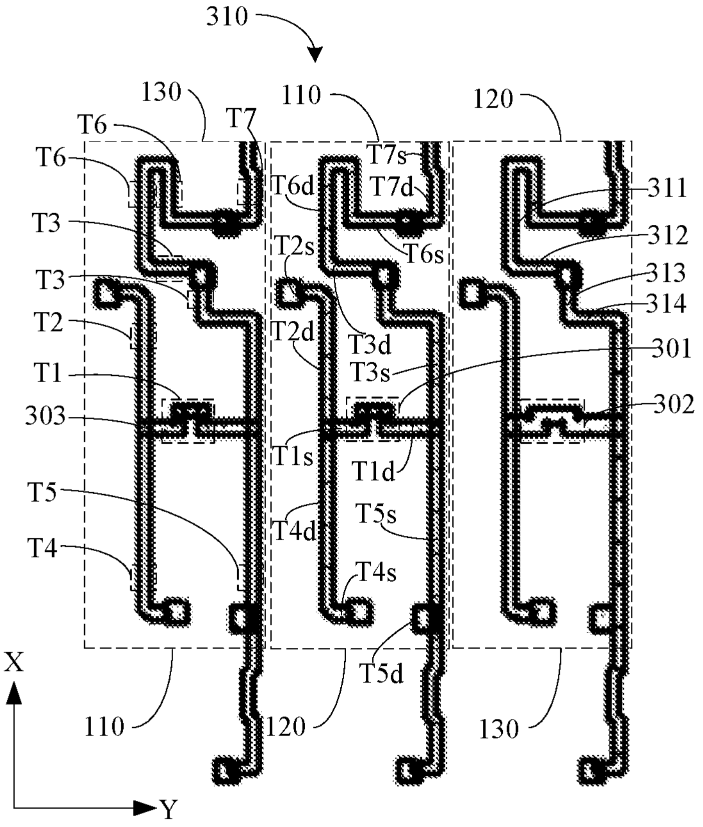
FIGS. 2 to 7 are partial schematic views of each layer of a display substrate provided by an example of the present application.

FIGS. 2-7 are schematic diagrams of various layers of a pixel circuit according to an embodiment of the present application. The following describes the positional relationship of each circuit in the pixel circuit on the backplane with reference to FIGS. 2-7. The example shown in FIG. 2-7 takes the pixel circuit 221 of one pixel group as an example, and takes the positions of the transistors included in the first color sub-pixel 110 for illustration. The positions of the transistors in the pixel circuits of the second color sub-pixel 120 and the third color sub-pixel 130 are substantially the same as the positions of the transistors included in the first color sub-pixel. As shown in FIG. 2, the pixel circuit 221 of the first color sub-pixel 110 includes a driving transistor T1, a data writing transistor T2, a threshold compensation transistor T3, a first light emitting control transistor T4, and a second light emitting control transistor T5, a first reset transistor T6, a second reset transistor T7 and a capacitor C, as shown in FIG. 1.

FIG. 2-7 also shows a scan signal line Ga1, a reset control signal line Rst1, a reset power supply signal line Init1, a light emitting control signal line EM1, a data line Vd, power supply signal lines (including a first power supply signal line VDD1, a second power supply signal line VDD3 and a third power supply signal line VDD2 of the first power supply terminal VDD) and a shielding line 344. The first power supply signal line VDD1 and the second power supply signal line VDD3 are electrically connected to each other, and the first power supply signal line VDD1 and the third power supply signal line VDD2 are electrically connected to each other. The second power supply line VDD3 includes a first power supply sub-line VDD31 extending along a first direction Y and a second power supply sub-line VDD32 extending along a second direction X. The first power supply sub-line VDD31 intersects with the second power supply sub-line VDD32.

The scan signal line Ga1 is configured to provide a scan signal for the pixel group; the reset control signal line Rst1 is configured to provide a reset control signal for the pixel group; the reset power supply signal line Init1 is configured to provide a reset power signal for the pixel group; the light emitting control signal line EM1 is configured to provide a light emitting control signal for the pixel group; the data line Vd is configured to provide a light emitting data signal for the pixel group; the first power supply signal line VDD1, the second power supply signal line VDD3 and the third power supply signal line VDD2 are configured to provide power signals to pixel groups.

For example, FIG. 2 shows an active semiconductor layer 310 of the pixel circuit in the display substrate. The active semiconductor layer 310 can be formed by patterning a semiconductor material. The active semiconductor layer 310 can be used to fabricate channels for the driving transistor T1, the data writing transistor T2, the threshold compensation transistor T3, the first light emitting control transistor T4, the second light emitting control transistor T5, the first reset transistor T6 and the second reset transistor T7 as described above. The active semiconductor layer 310 includes channels and source and drain regions of the transistors of the sub-pixels (i.e., the source regions s corresponding to respective source electrodes (e.g., a source electrode T1*s* of the driving transistor T1, a source electrode T2*s* of the data writing transistor T2, a source electrode T3*s* of the threshold compensation transistor T3, a source electrode T4*s* of the first light emitting control transistor T4, a source electrode T5*s* of the second light emitting control transistor T5, a source electrode T6*s* of the first reset transistor T6 and a source electrode T7*s* of the second reset transistor T7) and the drain regions d corresponding to respective drain electrodes (e.g., a drain electrode T1*d* of the driving transistor T1, a drain electrode T2*d* of the data writing transistor T2, a drain electrode T3*d* of the threshold compensation transistor T3, a drain electrode T4*d* of the first light emitting control transistor T4, a drain electrode T5*d* of the second light emitting control transistor T5, a drain electrode T6*d* of the first reset transistor T6 and a drain electrode T7*d* of the second reset transistor T7) shown in the second color sub-pixel, for example), and a channel and source and drain regions of each transistor in the same pixel circuit are integrally formed. The active semiconductor layer 310 shown in FIG. 2 includes a channel 301 of a first color sub-pixel, a channel 302 of a second color sub-pixel, and a channel 303 of a third color sub-pixel.

It should be noted that the active semiconductor layer can include an integrally formed low temperature polysilicon layer, and the source region and the drain region can become conductive by doping or the like to achieve electrical connection of the components. That is, the active semiconductor layer of each transistor of each sub-pixel is an overall pattern formed by p-silicon, and the transistors in the same pixel circuit include source and drain regions (i.e., source region s and drain region d) and channels, the channels of different transistors are separated by source and drain regions.

In one embodiment, the active semiconductor layers in the pixel circuits of sub-pixels of different colors arranged along the first direction have no connection relationship and are disconnected from each other. The active semiconductor layers in the pixel circuits of the sub-pixels of the same color arranged along the second direction can be integrally arranged or disconnected from each other.

In one embodiment, the active semiconductor layer 310 can be made of amorphous silicon, polysilicon, oxide semiconductor materials, or the like. It should be noted that, the above-mentioned source region and drain region can be regions doped with n-type impurities or p-type impurities.

Figure 3:
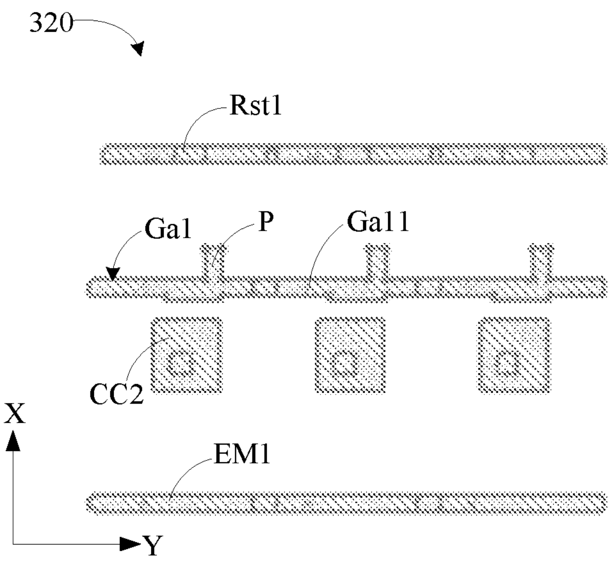
Figure 8:
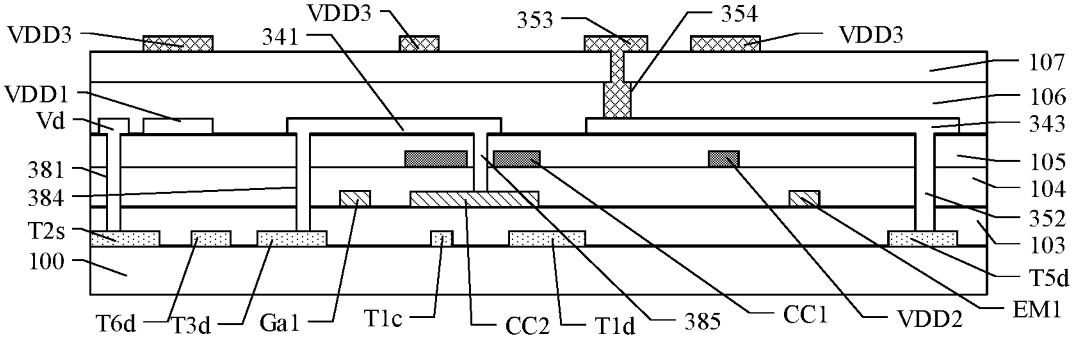
FIG. 8 is a partial cross-sectional view at a position of a display substrate provided by an example of the present application.
Figure 9:
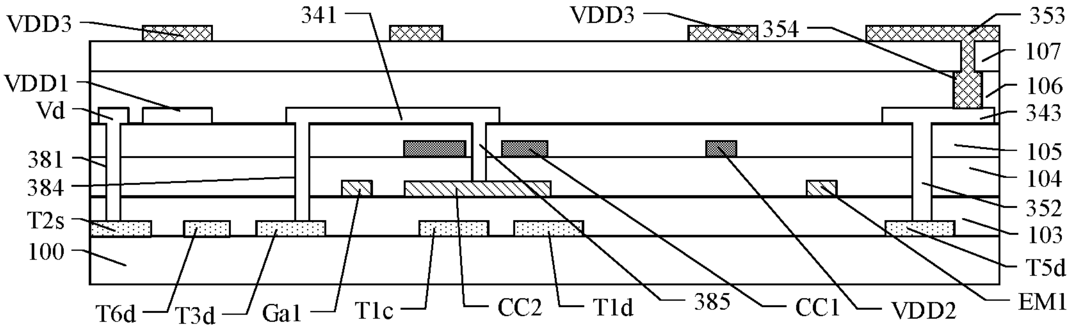
FIG. 9 is a partial cross-sectional view of another position of the display substrate provided by an example of the present application.

For example, a gate metal layer of the pixel circuit can include a first conductive layer and a second conductive layer. A gate insulating layer 103 (as shown in FIG. 8 and FIG. 9) is formed on the above-mentioned active semiconductor layer 310 to protect the above-mentioned active semiconductor layer 310, and the active semiconductor layer 310 is disposed on the base substrate 100. FIG. 3 shows the first conductive layer 320 included in the display substrate. The first conductive layer 320 is disposed on the gate insulating layer so as to be insulated from the active semiconductor layer 310. The first conductive layer 320 can include a second polar plate CC2 of the capacitor C, a scan signal line Ga1, a reset control signal line Rst1, a light emitting control signal line EM1, a driving transistor T1, a data writing transistor T2, a threshold compensation transistor T3, and gate electrodes of a first light emitting control transistor T4, a second light emitting control transistor T5, a first reset transistor T6 and a second reset transistor T7. The scan signal line Ga1 includes a main body portion Gall of the scan signal line and a protruding portion P protruding from one side of the main body portion Gall of the scan signal line.

For example, as shown in FIG. 3, the gate electrode of the data writing transistor T2 can be the portion where the scan signal line Ga1 and the active semiconductor layer 310 overlap. The gate electrode of the first light emitting control transistor T4 can be a first part where light emitting control signal line EM1 overlaps with the active semiconductor layer 310, the gate electrode of the second light emitting control transistor T5 can be a second part where the light emitting control signal line EM1 overlaps with the active semiconductor layer 310. The gate electrode of the first reset transistor T6 is a first part where the reset control signal line Rst1 overlaps with the active semiconductor layer 310, and the gate electrode of the second reset transistor T7 is a second part where the reset control signal line Rst1 overlaps with the active semiconductor layer 310. The threshold compensation transistor T3 can be the thin film transistor with double gate electrode structure, the first gate electrode of the threshold compensation transistor T3 can be the portion where the scan signal line Ga1 overlaps with the active semiconductor layer 310, and the second gate electrode of the threshold compensation transistor T3 can be the part where the protruding portion P of the scan signal line Ga1 overlaps with the active semiconductor layer 310. As shown in FIGS. 1 and 3, the gate electrode of the driving transistor T1 can be the second polar plate CC2 of the capacitor C.

It should be noted that the dotted-line rectangle boxes in FIG. 2 show the parts where the first conductive layer 320 overlaps with the active semiconductor layer 310.

For example, as shown in FIG. 3, the scan signal line Ga1, the reset control signal line Rst1, and the light emitting control signal line EM1 are arranged in the second direction X. The scan signal line Ga1 is disposed between the reset control signal line Rst1 and the light emitting control signal line EM1. The signal line extending in the first direction means that the row of the signal line as a whole extends in the first direction, and an area of the part of the signal line extending in the first direction is much larger than an area of the part extending in the second direction. The signal line extending in the second direction means that the row of the signal line as a whole extends along the second direction, and an area of the part of the signal line extending in the second direction is much larger than an area of the part extending in the first direction.

For example, in the second direction X, the second polar plate CC2 of the capacitor C (i.e. the gate electrode of the driving transistor T1) is disposed between the scan signal line Ga1 and the light emitting control signal line EM1. The protruding portion P of the scan signal line Ga1 is disposed on the side of the scan signal line Ga1 away from the light emitting control signal line EM1.

For example, as shown in FIG. 2, in the second direction X, the gate electrode of the data writing transistor T2, the gate electrode of the threshold compensation transistor T3, the gate electrode of the first reset transistor T6, and the gate electrode of the second reset transistor T7 are both disposed on a first side of the gate electrode of the driving transistor T1. The gate electrode of the first light emitting control transistor T4 and the gate electrode of the second light emitting control transistor T5 are both disposed on a second side of the gate electrode of the driving transistor T1. For example, in the examples shown in FIGS. 2-7, the first side and the second side of the gate electrode of the driving transistor T1 of the pixel circuit of the first color sub-pixel are two sides of the gate electrode of the driving transistor T1 in the second direction X which are opposite with respect to each other. For example, as shown in FIGS. 2-7, in the XY plane, the first side of the gate electrode of the driving transistor T1 of the pixel circuit of the first color sub-pixel can be the upper side of the gate electrode of the driving transistor T1, and the second side of the gate electrode of the driving transistor T1 of the pixel circuit of the first color sub-pixel can be the lower side of the gate electrode of the driving transistor T1. For the lower side, for example, the side of the display substrate used to bind the driving chip is the lower side of the display substrate, and the lower side of the gate electrode of the driving transistor T1 is the side of the gate electrode of the driving transistor T1 that is closer to the driving chip. The upper side is the opposite side to the lower side, for example, the side of the gate electrode of the driving transistor T1 that is farther from the driving chip.

For example, in some embodiments, as shown in FIGS. 2-7, in the first direction Y, the gate electrode of the data writing transistor T2 and the gate electrode of the first light emitting control transistor T4 are both disposed at a third side of the gate electrode of the driving transistor T1, the first gate electrode of the threshold compensation transistor T3, the gate electrode of the second light emitting control transistor T5 and the gate electrode of the second reset transistor T7 are both disposed on a fourth side of the gate electrode of the driving transistor T1. For example, in the examples shown in FIGS. 2-7, the third side and the fourth side of the gate electrode of the driving transistor T1 of the pixel circuit of the first color sub-pixel are two sides of the gate electrode of the driving transistor T1 in the first direction Y which are opposite with respect to each other. For example, as shown in FIGS. 2-7, the third side of the gate electrode of the driving transistor T1 of the pixel circuit of the first color sub-pixel can be the left side of the gate electrode of the driving transistor T1 of the pixel circuit of the first color sub-pixel, and the fourth side of the gate electrode of the driving transistor T1 of the pixel circuit of the first color sub-pixel can be the right side of the gate electrode of the driving transistor T1 of the pixel circuit of the first color sub-pixel. For the left side and the right side, for example, in the same pixel circuit, the data line is on the left side of the first power supply signal line VDD1, and the first power supply signal line VDD1 is on the right side of the data line.

Figure 4:
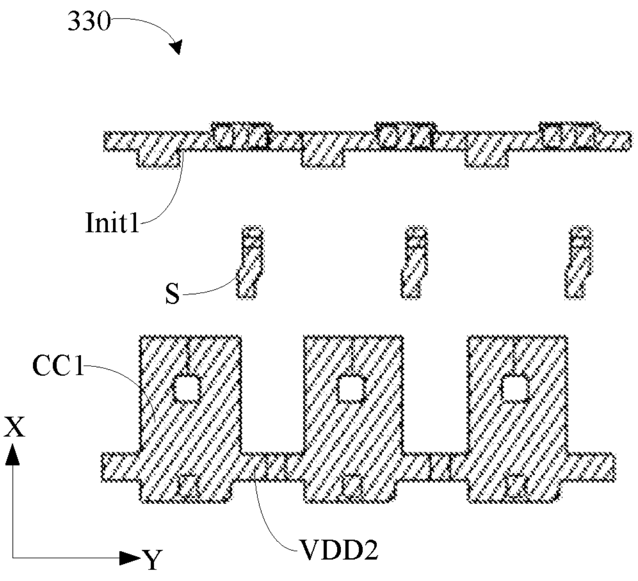

For example, a first insulating layer 104 (as shown in FIG. 8 and FIG. 9) is formed on the above-mentioned first conductive layer 320 to protect the above-mentioned first conductive layer 320. FIG. 4 shows the second conductive layer 330 of the pixel circuit. The second conductive layer 330 includes the first polar plate CC1 of the capacitor C, the reset power supply signal line Init1, the third power supply signal line VDD2 and the light shielding portion S. The third power supply signal line VDD2 is integrally formed with the first polar plate CC1 of the capacitor C. The first polar plate CC1 of the capacitor C and the second polar plate CC2 of the capacitor C at least partially overlap to form the capacitor C.

Figure 5:
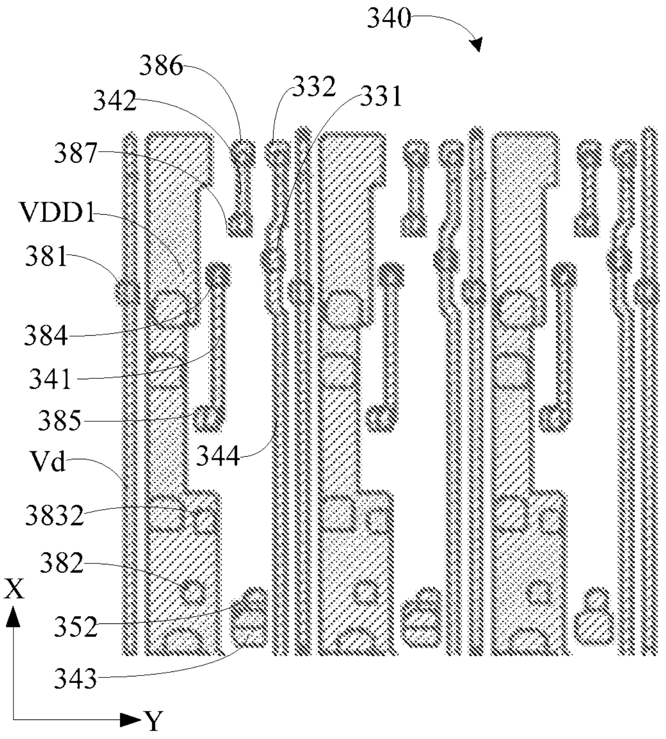

For example, a second insulating layer 105 (as shown in FIG. 8 and FIG. 9) is formed on the above-mentioned second conductive layer 330 to protect the above-mentioned second conductive layer 330. FIG. 5 shows a source-drain metal layer 340 of the pixel circuit. The source-drain metal layer 340 includes a data line Vd, a first power supply signal line VDD1 and a shielding line 344. The data line Vd, the first power supply signal line VDD1 and the shielding line 344 all extend along the second direction X. The shielding line 344 and the data line Vd are disposed in the same layer and made of the same material, so that the shielding line and the data line can be formed in the same patterning process at the same time, eliminating additional patterning process for making the shielding line, thereby simplifying the production process of the display substrate, and lowering the production cost. For example, the source-drain metal layer 340 further includes a connection structure 341, a connection part 342 and a first electrode connection sub-structure 343 of the electrode connection structure. One end of the connection structure 341 is connected to the gate electrode of the driving transistor T1, and the other end of the connection structure 341 is connected to the source and drain regions of the threshold compensation transistor T3.

FIG. 5 also shows exemplary locations of a plurality of via holes through which the source-drain metal layer 340 passes to connect to a plurality of film layers disposed between the source-drain metal layer 340 and the base substrate. For example, the source-drain metal layer 340 is connected to the active semiconductor layer 310 shown in FIG. 2 through via holes 381, 382, 384, 387 and 352, and the source-drain metal layer 340 passes through the via holes 3832, 386, 385, 331 and 332 and connected to the second conductive layer 330 shown in FIG. 4. The specific film layer where each via hole is disposed and the specific connection relationship will be described in detail with reference to FIG. 7 later.

For example, a third insulating layer 106 and a fourth insulating layer 107 (as shown in FIGS. 8 and 9) are formed on the above-mentioned source-drain metal layer 340 to protect the above-mentioned source-drain metal layer 340. The organic light emitting element of each sub-pixel can be disposed on a side of the third insulating layer and the fourth insulating layer away from the base substrate.

Figure 6:
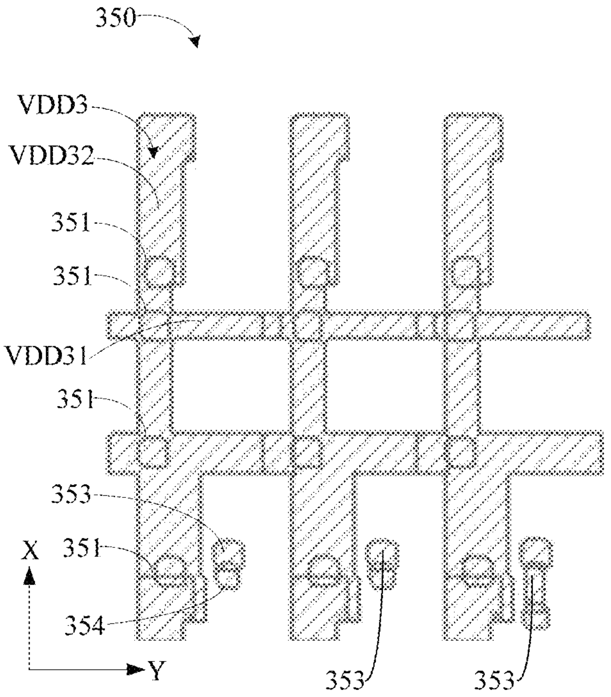

FIG. 6 shows the third conductive layer 350 of the pixel circuit. The third conductive layer 350 includes a second electrode connection sub-structure 353 of the electrode connection structure and second power supply signal lines VDD3 distributed along the second direction X and the first direction Y respectively and intersect with one another. FIG. 6 also shows exemplary locations of a plurality of via holes 351 and 354 through which the third conductive layer 350 is connected to the source-drain metal layer 340.

Figure 7:
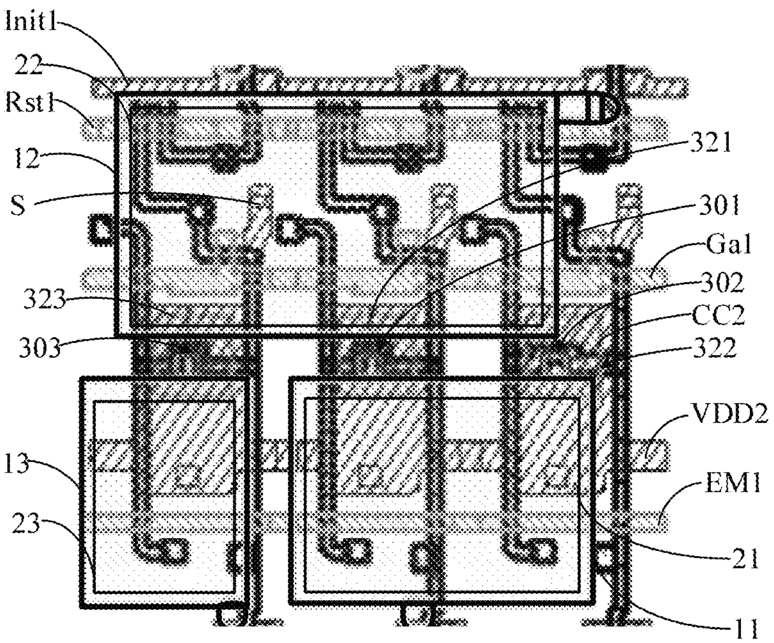

FIG. 7 is a schematic diagram of the stacking positional relationship of the active semiconductor layer 310, the first conductive layer 320, the second conductive layer 330, the source-drain metal layer 340 and the third conductive layer 350 described above. As shown in FIGS. 2-7, the data line Vd is connected to the source region of the data writing transistor T2 in the active semiconductor layer 310 through at least one via hole (e.g., the via hole 381) in the gate insulating layer, the first insulating layer, and the second insulating layer. The first power supply signal line VDD1 communicates with the source region of the corresponding first light emitting control transistor T4 in the active semiconductor layer 310 through at least one via hole (e.g., the via hole 382) in the gate insulating layer, the first insulating layer, and the second insulating layer.

As shown in FIGS. 2-7, one end of the connection structure 341 is connected to the drain region of the corresponding threshold compensation transistor T3 in the active semiconductor layer 310 through at least one via hole (e.g., the via hole 384) in the gate insulating layer, the first insulating layer and the second insulating layer, and the other end of the connection structure 341 is connected to the gate electrode of the driving transistor T1 (i.e., the second polar plate CC2 of the capacitor C) in the first conductive layer 320 through at least one via (e.g., the via hole 385) in the first insulating layer and the second insulating layer. One end of the connection part 342 is connected to the reset power supply signal line Init1 through a via hole (for example, the via hole 386) in the second insulating layer, and the other end of the connection part 342 is connected to the drain region of the second reset transistor T7 in the active semiconductor layer 310 through at least one via (e.g., the via hole 387) in the gate insulating layer, the first insulating layer and the second insulating layer. The first electrode connection sub-structure 343 is connected to the drain region of the second light emitting control transistor T5 in the active semiconductor layer 310 through at least one via hole (e.g., the via hole 352) in the gate insulating layer, the first insulating layer, and the second insulating layer. It should be noted that the source region and the drain region of the transistor mentioned in the embodiments of the present disclosure can be the same in structure, so the source region and the drain region of the transistor can be indistinguishable in structure. Therefore, the two are interchangeable as required.

For example, as shown in FIGS. 2-7, the first power supply signal line VDD1 passes through at least one via hole (e.g., via hole 3832) in the second insulating layer between the second conductive layer 330 and the source-drain metal layer 340 and connected to the first polar plate CC1 of the capacitor C in the second conductive layer 330.

For example, as shown in FIGS. 2-7, the shielding line 344 extends along the second direction X, and an orthographic projection of the shielding line 344 on the base substrate is disposed between an orthographic projection of the driving transistor on the base substrate and an orthographic projection of the data line on the base substrate. For example, the shielding line in the pixel circuit of the first color sub-pixel can reduce the influence of the signal transmitted through the data line in the pixel circuit of the second color sub-pixel on the performance of the threshold compensation transistor T3 of the first color sub-pixel, further, reduce the influence of the coupling between the gate electrode of the driving transistor of the first color sub-pixel and the data line of the second color sub-pixel, and alleviate the problem of crosstalk.

For example, as shown in FIGS. 2-7, the shielding line 344 is connected to the reset power signal line Init1 through at least one via hole (e.g., the via hole 332) in the second insulating layer, except that the shielding line has a fixed potential, and also makes the voltage of the initialization signal transmitted on the reset power supply signal line more stable, which is more beneficial to the working performance of the pixel driving circuit.

For example, as shown in FIGS. 2-7, the shielding line 344 is electrically connected to the reset power signal line so that the shielding line has a fixed potential. The shielding line 344 can be electrically connected to the two reset power signal lines Init1 extending in the Y direction respectively, and the two reset power signal lines Init1 are respectively disposed on two sides of the shielding line 344 along the X direction. For example, the two reset power supply signal lines correspond to the pixel circuits of the nth row and the (n+1)th row respectively.

For example, the shielding line 344 in the same column can be a whole shielding line, and the whole shielding line includes a plurality of sub-sections disposed between two adjacent reset power supply signal lines, and each sub-section is respectively disposed within each pixel circuit area in the column.

For example, in addition to coupling the shielding line 344 with the reset power signal line, the shielding line 344 can also be coupled with the first power signal line, so that the shielding line 344 has the same fixed potential as the first power signal line.

For example, an orthographic projection of the shielding line 344 on the base substrate is disposed between an orthographic projection of the threshold compensation transistor T3 on the base substrate and an orthographic projection of the data line Vd on the base substrate, so that the shielding line 344 can reduce the influence of the change in signal transmitted on the data line on the performance of the threshold compensation transistor T3, further reduce the influence of the coupling between the gate electrode of the driving transistor and the data signal line Vd(n+1), and solve the problem of vertical crosstalk, so that when the display substrate can achieve a better display effect when being used for display.

For example, the orthographic projection of the shielding line 344 on the base substrate can be disposed between the orthographic projection of the connection structure 341 on the base substrate and the orthographic projection of the data line on the base substrate. The orthographic projection of the shielding line 344 on the base substrate T1 is disposed between the orthographic projection of the driving transistor T1 on the base substrate and the orthographic projection of the data line on the base substrate.

The above-mentioned configuration can well reduce a first crosstalk generated between the data line and the threshold compensation transistor, and a second crosstalk generated between the data line and the connection structure, thereby reducing indirect crosstalk to the driving transistor due to the first crosstalk and the second crosstalk. In addition, the above-mentioned configuration can also reduce direct crosstalk between the data line and the driving transistor, thereby better ensuring the working performance of the display substrate.

For example, the shielding line 344 is not limited to the above-mentioned configuration, and the shielding line 344 can also be only coupled with the reset power supply signal line corresponding to the pixel circuit in the nth row, or only with the reset power supply signal line corresponding to the pixel circuit in the (n+1)th row. Moreover, the length of the shielding line 344 extending in the second direction X can also be set according to actual needs.

For example, the pixel circuit of a sub-pixel of a color also includes a light shielding portion S. The light shielding portion S and the shielding line 344 are disposed in different layers, and an orthographic projection of the light shielding portion S on the base substrate has overlap with an orthographic projection of the shielding line 344 on the base substrate. The shielding line 344 is connected to the light shielding portion S in the second conductive layer 330 through the via hole 331 in the second insulating layer, so that the light shielding portion S has a fixed potential, thereby better reducing coupling effect between the threshold compensation transistor T3 and other conductive patterns nearby, making the working performance of the display substrate more stable.

For example, the light shielding portion S has overlap with the active semiconductor layer 310 between and the two gate electrodes of the threshold compensation transistor T3, to prevent the active semiconductor layer 310 from being illuminated to change characteristics, such as the voltage of this part of the active semiconductor layer is prevented from changing to prevent crosstalk.

This example schematically shows that the light shielding portion being connected to the shielding line, but it is not limited to this, and the two can also be in disconnection.

For example, as shown in FIGS. 2-7, the second power supply signal line VDD3 is connected to the first power supply signal line VDD1 through at least one via hole 351 in the third insulating layer and the fourth insulating layer, and the second electrode connection sub-structure 353 is connected to the first electrode connection sub-structure 343 through the via hole 354 in the third insulating layer and the fourth insulating layer.

For example, the third insulating layer can be a passivation layer, the fourth insulating layer can be a planarization layer, and the third insulating layer is disposed between the fourth insulating layer and the base substrate. The fourth insulating layer can be an organic layer, and the thickness of the organic layer is thicker than that of the inorganic layers such as the passivation layer.

For example, the via hole 351 and the via hole 354 are both nested via holes. That is, the via hole 351 includes a first via hole in the third insulating layer and a second via hole in the fourth insulating layer, with the position of the first via hole in the third insulating layer being opposite to the position of the second via hole in the fourth insulating layer, and an orthographic projection of the second via holes in the fourth insulating layer on the base substrate being located within an orthographic projection of the first via hole in the third insulating layer on the base substrate.

For example, the second power supply signal lines VDD3 are distributed in a grid form. An orthographic projection of the second power supply sub-line VDD32 of the second power supply signal line VDD3 extending along the X direction on the base substrate is substantially coincides with an orthographic projection of the first power supply line VDD1 on the base substrate, or the orthographic projection of the first power supply line VDD1 on the base substrate is located within the orthographic projection of second power supply sub-line VDD32 on the base substrate. In addition, the power supply signal line VDD3 being electrically connected to the first power supply signal line VDD1 can reduce the voltage drop of the first power supply signal line VDD1, thereby improving the uniformity of the display device.

For example, the second power supply signal line VDD3 can be made of the same material as the source-drain metal layer.

For example, as shown in FIG. 5, the first electrode connection sub-structures 343 of the first color sub-pixel, the second color sub-pixel and the third color sub-pixel are all block structures. The subsequently formed first electrode of a sub-pixels of a color will be connected to the corresponding second electrode connection sub-structure 353 through a via hole so as to be connected to the drain region of the second light emitting control transistor T5.

This embodiment includes, but is not limited to, the position of the second electrode connection sub-structure in a sub-pixel of a color is determined according to the arrangement of the organic light emitting elements and the position of the light emitting region.

For example, FIG. 8 is a schematic diagram of a partial cross-sectional structure of the display substrate where the layer shown in FIG. 7 is disposed, and FIG. 7 only illustrates part of the film layers in FIG. 8. As shown in FIGS. 7 and 8, in the active semiconductor layer in the pixel circuit of the second color sub-pixel 120, a gate insulating layer 103 is disposed on a side of the second electrode (e.g., the drain electrode T5*d*) of the second light emitting control transistor T5 away from the side of the base substrate 100, a light emitting control signal line EM1 is provided on a side of the gate insulating layer 103 away from the base substrate 100, a first insulating layer 104 is disposed on a side of the light emitting control signal line EM1 away from the base substrate 100, a third power supply signal line VDD2 is disposed on a side of the first insulating layer 104 away from the base substrate 100, a second insulating layer 105 is disposed on a side of the third power supply signal line VDD2 away from the base substrate 100, and a first electrode connection sub-structure 343 is disposed on a side of the second insulating layer 105 away from the base substrate 100. The first electrode connection sub-structure 343 of the second color sub-pixel 120 is connected to the second electrode T5*d* of the second light emitting control transistor T5 in the active semiconductor layer 310 through the via hole 352 in the gate insulating layer 103, the first insulating layer 104 and the second insulating layer 105. The first electrode connection sub-structure 343 has overlap with both the third power supply signal line VDD2 and the light emitting control signal line EM1. On a side of the first electrode connection sub-structure 343 away from the base substrate 100 is provided with a third insulating layer 106 and a fourth insulating layer 107 in this order, and on a side of the fourth insulating layer 107 away from the base substrate 100 is provided with a second electrode connection sub-structure 353 and a second power supply signal line VDD3. The second power supply signal line VDD3 has overlap with the third power supply signal line VDD2. The second electrode connection sub-structure 353 is connected to the first electrode connection sub-structure 343 through a nested via hole 354 in the third insulating layer 106 and the fourth insulating layer 107, thereby realizing connection with the second light emitting control transistor.

For example, as shown in FIG. 8, the data line Vd is connected to the source electrode T2*s* of the data writing transistor T2 through the via hole 381 in the gate insulating layer 103, the first insulating layer 104 and the second insulating layer 105. One end of the connection structure 341 is connected to the drain electrode T3*d* of the threshold compensation transistor T3 through the via hole 384 in the gate insulating layer 103, the first insulating layer 104 and the second insulating layer 105, and the other end of the connection structure 341 is connected to the gate electrode of the driving transistor T1 (i.e., the second polar plate CC2 of the capacitor C) through the via hole 385 in the first insulating layer 104, the second insulating layer 105. The channel T1*c* of the driving transistor T1 is disposed on the side of the gate electrode facing the base substrate 100, and has no overlap with the via hole 385, the source electrode T1*d* of the driving transistor T1 has overlap with both the its gate electrode and the first electrode polar plate CC1 of the capacitor C.

For example, FIG. 9 is a schematic diagram of a partial cross-sectional structure of the display substrate where the layer shown in FIG. 7 is disposed, and FIG. 7 only illustrates a part of the film layers in FIG. 9. As shown in FIGS. 7-9, the difference between the first color sub-pixel 110 and the second color sub-pixel 120 is that in the second color sub-pixel 120, an orthographic projection of the second electrode connection sub-structure 353 on the base substrate 100 has no overlap with an orthographic projection of the second electrode T5*d* of the second light emitting control transistor T5 thereof on the base substrate 100, while in the first color sub-pixel 110, an orthographic projection of the second electrode connection sub-structure 353 on the base substrate 100 has overlap with an orthographic projection of the second electrode T5*d* of the second light emitting control transistor T5 thereof on the base substrate 100. In the first color sub-pixel 110, the first electrode connection sub-structure 343 has no overlap with either the third power supply signal line VDD2 or the light emitting control signal line EM1. In the first color sub-pixel 110, the channel T1*c* of the driving transistor T1 is disposed on a side of the gate electrode of the driving transistor T1 facing the base substrate 100 and has overlap with the via hole 385. From this, it can be seen that the width of the channel of the driving transistor of the first color sub-pixel is larger than the width of the channel of the second color sub-pixel.

For example, as shown in FIGS. 2-7, in the second direction X, the scan signal line Ga1, the reset control signal line Rst1 and the reset power supply signal line Init1 are all disposed on a first side of the gate electrode of the driving transistor T1 of the pixel circuit of the first color sub-pixel, the light emitting control signal line EM 1 is disposed on a second side of the driving transistor T1 of the pixel circuit of the first color sub-pixel.

For example, the scan signal line Ga1, the reset control signal line Rst1, the light emitting control signal line EM1, and the reset power supply signal line Init1 all extend in the first direction Y, and the data line Vd extends in the second direction X.

It should be noted that the positional arrangement relationship of the driving circuit, the first light emitting control circuit, the second light emitting control circuit, the data writing circuit, the storage circuit, the threshold compensation circuit and the reset circuit in each pixel circuit is not limited to the examples shown in FIGS. 2-7, the positions of the driving circuit, the first light emitting control circuit, the second light emitting control circuit, the data writing circuit, the storage circuit, the threshold compensation circuit and the reset circuit can be specifically set according to actual application requirements.

For example, as shown in FIGS. 2-9, the first electrode 11 of the first color sub-pixel is connected to the second electrode connection sub-structure 353 through the via hole (not shown) of the fifth insulating layer, thereby realizing connection with the drain region of the second light emitting control transistor T5. Similarly, the first electrode 13 of the organic light emitting element of the third color sub-pixel is connected to the second electrode connection sub-structure 353 through the via hole (not shown) of the fifth insulating layer, so as to realize the connection with the drain region of the second light emitting control transistor T5. The first electrode 12 of the second color sub-pixel is connected to the second electrode connection sub-structure 353 through the via hole of the fifth insulating layer, and then connected to the second electrode connection sub-structure 343, so as to realize the connection with the drain region of the second light emitting control transistor T5.

The embodiment of the present application provides a novel pixel arrangement, which will be introduced below. As shown in FIG. 7, an orthographic projection of the pixel opening 21 of the first color sub-pixel on the base substrate has no overlap with an orthographic projection of the channel 301 of the driving transistor of the first color sub-pixel on the base substrate. An orthographic projection of the pixel opening 22 of the second color sub-pixel on the base substrate has no overlap with an orthographic projection of the channel 302 of the driving transistor of the second color sub-pixel on the base substrate. An orthographic projection of the pixel opening 23 of the third color sub-pixel on the base substrate has no overlap with an orthographic projection of the channel 303 of the driving transistor of the third color sub-pixel on the base substrate. The above-mentioned arrangement of pixels is different from the arrangement of pixels in display panels existing in the art.

In one embodiment, the plurality of sub-pixels are divided into a plurality of pixel groups, each of the pixel groups including a first color sub-pixel, a second color sub-pixel, and a third color sub-pixel. At least one of the pixel groups includes two rows of sub-pixels arranged along the first direction, wherein one row of sub-pixels arranged along the first direction includes first color sub-pixels and third color sub-pixels which are alternately arranged, and the other row of sub-pixels arranged along the first direction includes second color sub-pixels. Here, a row of sub-pixels arranged along the first direction refers to that the organic light emitting elements of the sub-pixels are arranged along the first direction.

Figure 7A:
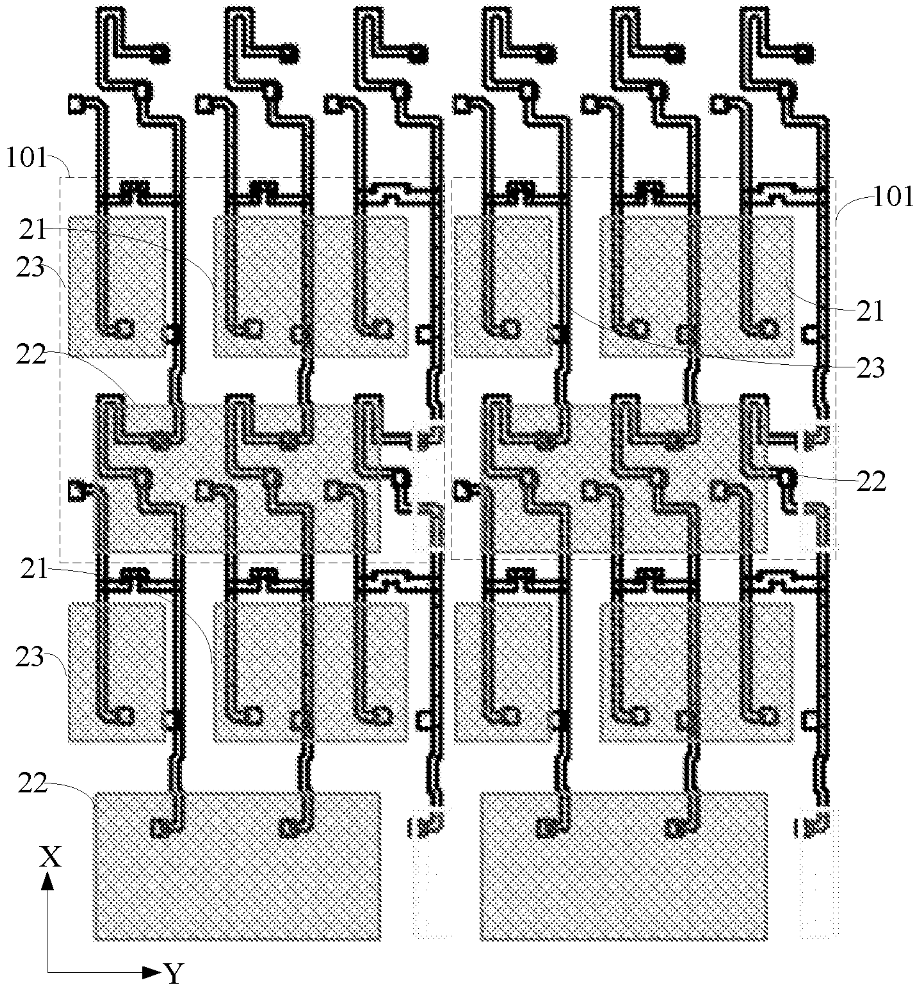
FIG. 7A is a schematic diagram of part of film layers of a plurality of pixel groups of a display substrate provided by an example of the present application.

In one embodiment, the first electrode of the sub-pixel or the pixel opening can be used as a reference to divide the plurality of sub-pixels into a plurality of pixel groups. In other embodiments, the pixel circuit of the sub-pixel can also be used as a reference to divide the plurality of sub-pixels into a plurality of pixel groups. FIG. 7A is a schematic diagram of part of the film layers of the plurality of pixel groups 101 in the display substrate where the layer shown in FIG. 7 is disposed, and illustrates the arrangement of the pixel openings of the plurality of pixel groups 101. Referring to FIG. 7A, the pixel openings of the same pixel group 101 are divided into two rows, wherein one row of first electrodes arranged along the first direction include pixel openings 21 of the first color sub-pixels and pixel openings 23 of the third color sub-pixels which are alternately arranged, and the other row of first electrodes arranged along the first direction include pixel openings 22 of the second color sub-pixels. In the embodiment shown in FIG. 7A, the pixel circuits of the same pixel group 101 are disposed in the same row. In other embodiments, the pixel circuits of the same pixel group 101 can also be disposed in different rows.

In one embodiment, referring to FIG. 7, any one of the orthographic projection of the pixel opening 21 of the first color sub-pixel on the base substrate, the orthographic projection of the pixel opening 22 of the second color sub-pixel on the base substrate or the orthographic projection of the pixel opening 23 of the third color sub-pixel on the base substrate has no overlap with any one of the orthographic projection of the channel 301 of the driving transistor of the first color sub-pixel on the base substrate, the orthographic projection of the channel 302 of the driving transistor of the second color sub-pixel on the base substrate, or the orthographic projection of the channel 303 of the driving transistor of the third color sub-pixel on the base substrate.

When displayed at high temperature, the lifespan of the display panel existing in the art is short, and a color shift phenomenon tends to occur during display. The inventor found that the reason for this problem is that when the display panel is displaying, the current of the driving transistor of the blue sub-pixel is relatively large. For example, the current of the driving transistor of the blue sub-pixel is 2.15 times that of the current of the driving transistor of the green sub-pixel. The channel of the driving transistor of the blue sub-pixel overlaps with the organic light emitting element of the green sub-pixel, resulting in a large temperature rise of the organic light emitting element of the green sub-pixel, which in turn causes the green sub-pixel to decay too quickly and shortens the lifespan. In addition, the brightness attenuation speeds of the sub-pixels of different colors are quite different, so that the color shift phenomenon occurs in the display screen. The above-mentioned arrangement of the sub-pixels can prevent the driving transistor of the second color sub-pixel from increasing the temperature of the organic light emitting element of the first color sub-pixel or the third color sub-pixel too much and resulting in an excessively fast luminance decay of the organic light emitting element. It helps to improve the lifespan of sub-pixels, can reduce the difference in the brightness decay speeds of sub-pixels of different colors and alleviate the color shift problem of the display substrate. Since the pixel openings of sub-pixels of each color and the channels of the driving transistor do not overlap, so that the temperature of the organic light emitting elements of the sub-pixels of the colors can be lowered, and the service life and color shift problems of the display panel can be improved.

In one embodiment, in at least one pixel group, a distance between the channel of the driving transistor of the sub-pixel and the scan signal line in the second direction X ranges from 1 μm to 50 μm. Specifically, a distance between the channel 301 of the driving transistor of the first color sub-pixel and the scan signal line Ga1 in the second direction ranges from 1 μm to 50 μm. A distance between the channel 302 of the driving transistor of the second color sub-pixel and the scan signal line Ga1 in the second direction ranges from 1 μm to 50 μm. A distance between the channel 303 of the driving transistor of the third color sub-pixel and the scan signal line Ga1 in the second direction ranges from 1 μm to 50 μm.

Further, in at least one pixel group, the distance between the channel of the driving transistor of the sub-pixel and the scan signal line in the second direction ranges from 10 μm to 50 μm. For example, the distance between the channel of the driving transistor of the sub-pixel and the scan signal line in the second direction is 10 μm, 15 μm, 20 μm, 25 μm, 30 μm, 35 μm, 40 μm, 45 μm, 50 μm, and so on.

In one embodiment, as shown in FIG. 7, in at least one of the pixel groups, the orthographic projection of the pixel opening corresponding to each of the sub-pixels on the base substrate has no overlap with the orthographic projection of the gate electrode of the driving transistor of any of the sub-pixels on the base substrate; or, the orthographic projection of the pixel opening corresponding to each of the sub-pixels on the base substrate has an overlapping region with the orthographic projection of the gate electrode of the driving transistor of any of the sub-pixels on the base substrate, and a ratio of the area of the overlapping region to the area of the gate electrode is not more than 10%. When the temperature of the driving transistor increases, the heat generated by the driving transistor is mainly transmitted to the organic light emitting element of the sub-pixel through the gate electrode. With the orthographic projection of the pixel opening corresponding to each of the sub-pixels on the base substrate having no overlap with the orthographic projection of the gate electrode of the driving transistor of any of the sub-pixels on the base substrate; or, the orthographic projection of the pixel opening corresponding to each of the sub-pixels on the base substrate having a relatively small area of an overlapping region with the orthographic projection of the gate electrode of the driving transistor of any of the sub-pixels on the base substrate, it can effectively reduce the amount of heat generated by the driving transistor that is transmitted to the organic light emitting element, and the temperature of the organic light emitting element can be prevented from rising too much, which would otherwise cause the organic light emitting element to decay too quickly and shorten its service life. It can improve the service life of sub-pixels and alleviate the color shift problem of display substrate.

Further, in the embodiment shown in FIG. 7, the distance between the gate electrode of the driving transistor of the sub-pixel and the scan signal line Ga1 in the second direction ranges from 2 μm to 10 μm. The distance between the gate electrode of the driving transistor of the sub-pixel and the scan signal line Ga1 in the second direction is, for example, 2 μm, 4 μm, 6 μm, 8 μm, 10 μm, and so on.

Figure 10:
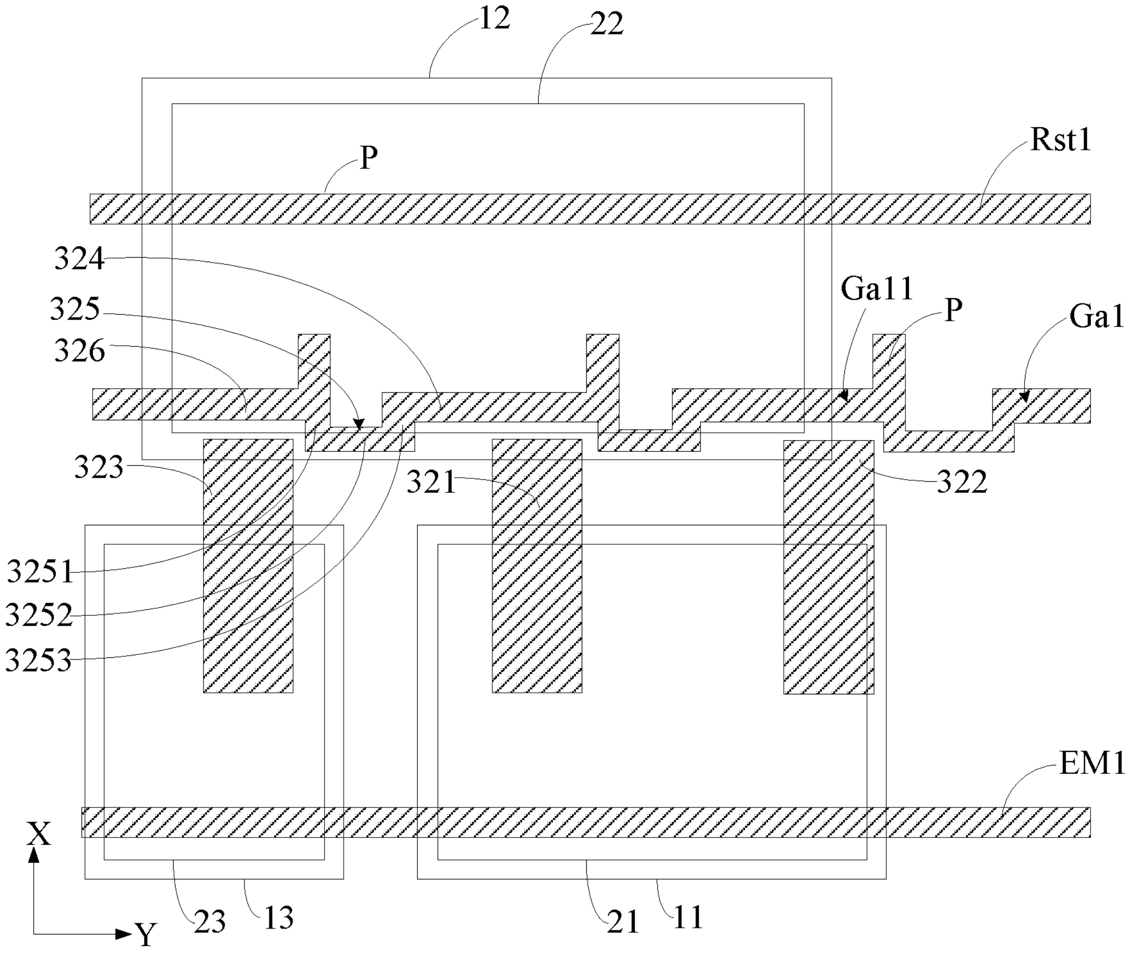
FIG. 10 is a partial schematic diagram of a plurality of film layers of a display substrate provided by another example of the present application.

In one embodiment, referring to FIG. 10, in at least one pixel group, the orthographic projection of the scan signal line Ga1 in the second direction X has overlap with the orthographic projection of the gate electrode of the driving transistor of the sub-pixel in the second direction X, where the second direction X is perpendicular to the first direction Y The orthographic projections of the scan signal line and the gate electrode of the driving transistor on the second direction X refer to the orthographic projections of the scan signal line and the gate electrode of the driving transistor on a straight line extending along the second direction X. As shown in FIG. 10, the orthographic projection of the scan signal line Ga1 in the second direction X has overlap with the orthographic projection of the gate electrode 321 of the driving transistor of the first color sub-pixel in the second direction X. The orthographic projection of the scan signal line Ga1 is in the second direction X has overlap with the orthographic projection of the gate electrode 322 of the driving transistor of the second color sub-pixel in the second direction X. The orthographic projection of the scan signal line Ga1 in the second direction X has overlap with the orthographic projection of the gate electrodes 323 of the driving transistor of the third color sub-pixel in the second direction X. Such configuration can make the arrangement of the components in the display substrate relatively closer to one another, which can increase the density of the sub-pixels in the display substrate.

In one embodiment, as shown in FIG. 10, the scan signal line Ga1 includes a main body portion Gall of the scan signal line and a protruding portion P protruding from one side of the main body portion Gall of the scan signal line. The main body portion Gall of the scan signal line extends along the first direction Y as a whole, and the protruding portion P extends along the second direction X. The threshold compensation transistor T3 of the sub-pixel includes a first gate electrode and a second gate electrode. In the threshold compensation transistor, the first gate electrode is a part of the main body portion Gall of the scan signal line that overlaps with the orthographic projection of the active semiconductor layer on the base substrate, and the second gate electrode is the part of the protruding portion P that overlaps the orthographic projection of the active semiconductor layer on the base substrate.

Figure 10A:
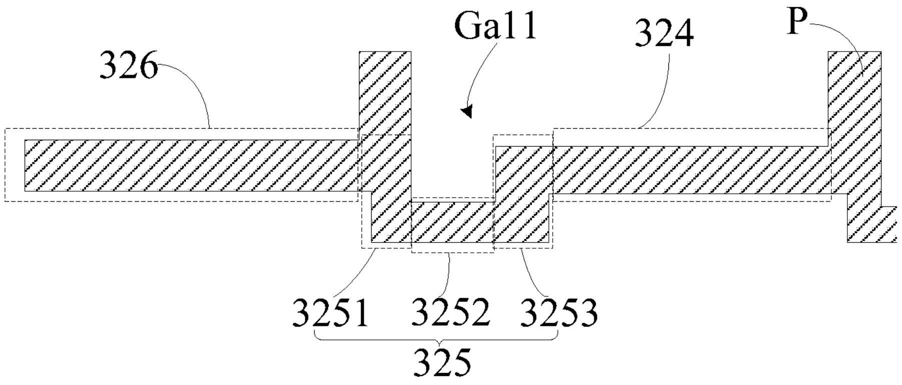
FIG. 10A is a partial enlarged view of a scan signal line in FIG. 10.

Further, as shown in FIG. 10 and FIG. 10A, the main body portion Gall of the scan signal line includes a first scan sub-line 324, a second scan sub-line 326 and a connection part 325. The first scan sub-line 324 is connected to the second scan sub-line 326 through the connection part 325. The first scan sub-line 324 and the second scan sub-line 326 extend substantially along the first direction Y In the same scan signal line, in the first direction, the protruding portion P and the connection part 325 are disposed on both sides of the first scan sub-line 324. In the illustrated embodiment, the protruding portion P is disposed on the side of the first scan sub-line 324 close to the first reset control signal line Rst1, and the connection part 325 is disposed on the side of the first scan sub-line 324 away from the first reset control signal line Rst1. In other embodiments, the connection part 325 can be disposed on the side of the first scan sub-line 324 close to the first reset control signal line Rst1, and the protruding portion P can be disposed on the side of the first scan sub-line 324 away from the first reset control signal line Rst1.

The first scan sub-line 324 is connected to the pixel circuit of the first color sub-pixel, the second scan sub-line 326 is connected to the pixel circuit of the second color sub-pixel, and extension direction of part of the connection part 325 intersects with the extension direction of the first scan sub-line 324. In the threshold compensation transistor, the first gate electrode is the part of the connection part 325 that overlaps with the orthographic projection of the active semiconductor layer on the base substrate.

Further, the orthographic projection of the connection part 325 in the second direction X has overlap with the orthographic projection of the gate electrode of the driving transistor of the sub-pixel in the second direction X. As shown in FIG. 10, the orthographic projection of the connection part 325 in the second direction X has overlap with all of the orthographic projection of the gate electrode 321 of the first color sub-pixel in the second direction X, the orthographic projection of the gate electrode 322 of the second color sub-pixel in the second direction X and the orthographic projection of the gate electrode 323 of the third color sub-pixel in the second direction X.

In one embodiment, as shown in FIG. 10 and FIG. 10A, the connection part 325 includes a first connection sub-part 3251, a second connection sub-part 3252 and a third connection sub-part 3253 that are connected in sequence. The extension direction of the first connection sub-part 3251 and the third connection sub-part 3253 intersect with the extension direction of the first scan sub-line 324, and the extension direction of the second connection sub-part 3252 is the same as the extension direction of the first scan sub-line 324. The third connection sub-part 3253 is connected to the first scan sub-line 324, and the first connection sub-part 3251 is connected to the second scan sub-line 326. In the threshold compensation transistor, the first gate electrode is a part of the second connection sub-part 3252 that overlaps with the orthographic projection of the active semiconductor layer on the base substrate.

Figure 2A:
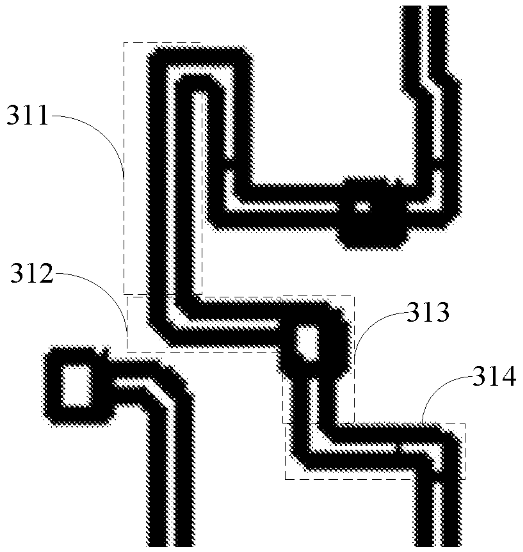
FIG. 2A is a partial enlarged view of FIG. 2.

In one embodiment, as shown in FIG. 2 and FIG. 2A, the active semiconductor layer 310 includes a first section 311, a second section 312, a third section 313 and a fourth section 314 that are connected in sequence. The second section 312, the fourth section 314 and the main body portion Gall of the scan signal line extend along the first direction Y, the first section 311 and the third section 313 extend in the second direction X. The second gate electrode of the threshold compensation transistor T3 is the part of the protruding portion P that overlaps with the orthographic projection of the fourth section 314 on the base substrate. The gate electrode of the reset transistor includes a part where the reset control signal line Rst1 overlaps with the orthographic projection of the first section 311 on the base substrate. Specifically, the first reset transistor T6 includes two gate electrodes, one of which includes the part of the reset control signal line Rst1 that overlaps the orthographic projection of the first section 311 on the base substrate. Such arrangement is convenient for the threshold compensation transistor T3 and the first reset transistor T6 to form a double gate electrode structure.

Further, as shown in FIG. 10, in at least one pixel group, the orthographic projection of the gate electrode of the driving transistor of at least one sub-pixel on the base substrate has overlap with the orthographic projection of its corresponding pixel opening on the base substrate. Specifically, the orthographic projection of the gate electrode 321 of the driving transistor of the first color sub-pixel on the base substrate has overlap with the orthographic projection of its corresponding pixel opening 21 on the base substrate; the orthographic projection of the gate electrode 323 of the driving transistor of the third color sub-pixel on the base substrate has overlap with the orthographic projection of its corresponding pixel opening 23 on the base substrate.

Further, the part where the orthographic projection of the gate electrode of at least the sub-pixel on the base substrate overlaps with the corresponding pixel opening on the base substrate has a size in the second direction X ranging from 0 to 30 μm. In the embodiment shown in FIG. 10, the orthographic projections of the gate electrode of the first color sub-pixel, the gate electrode of the second color sub-pixel and the gate electrode of the third color sub-pixel on the base substrate each has an overlapping part with the corresponding pixel opening on the base substrate of a size larger than 0 in the second direction X.

Figure 11:
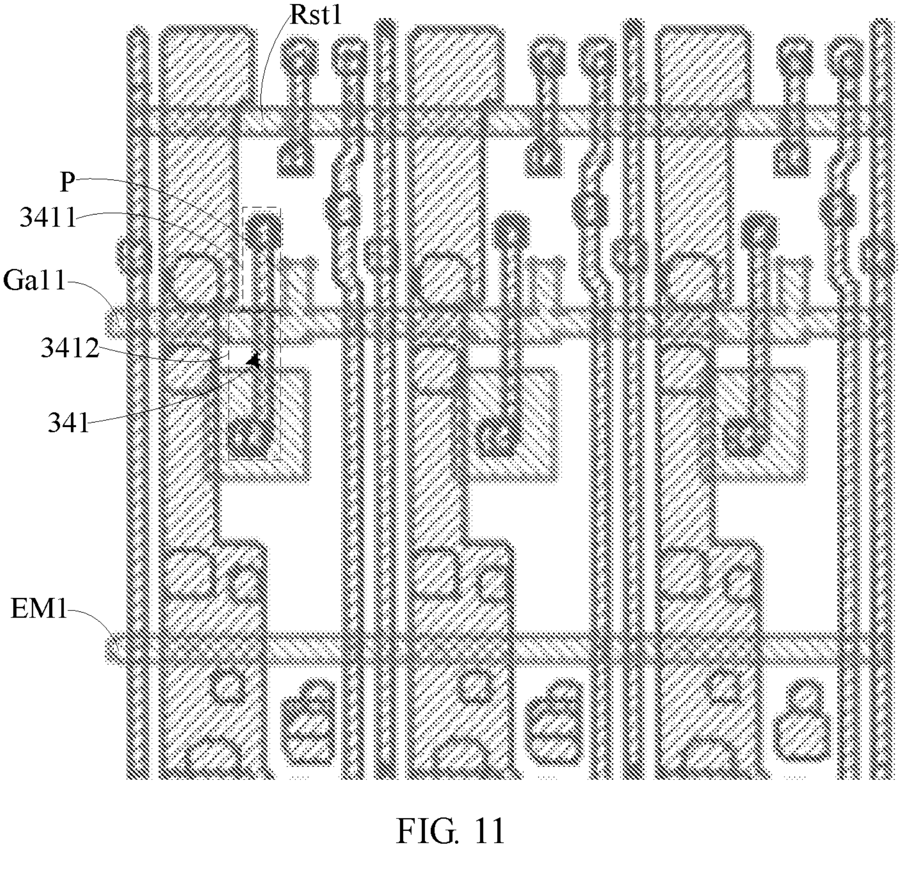
FIG. 11 is a partial schematic diagram of a part of a film layer of a display substrate provided by an example of the present application.
Figure 12:
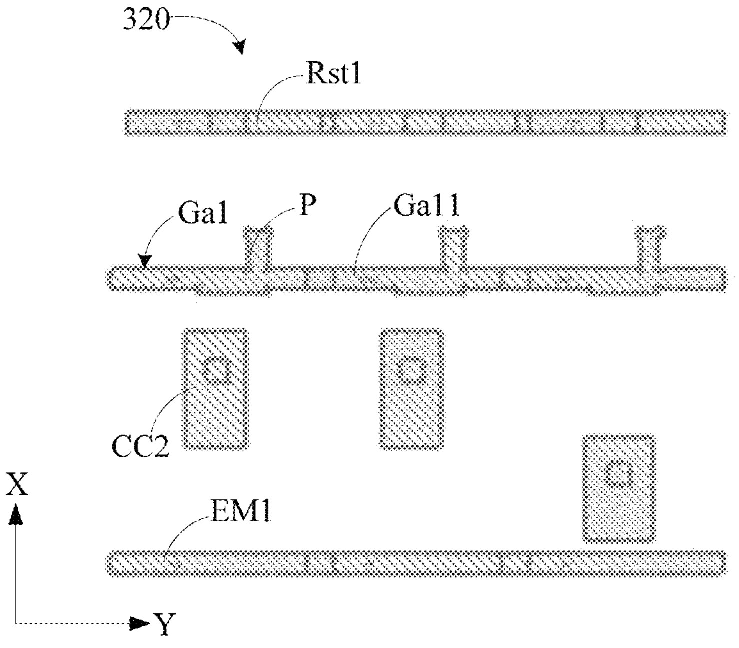
FIGS. 12 to 16 are partial schematic views of layers of a display substrate provided by still another example of the present application.

In one embodiment, as shown in FIG. 11, the connection structure 341 includes a first portion 3411 and a second portion 3412 connected to the first portion 3411. The orthographic projection of the first portion 3411 on the base substrate and the orthographic projection of the protruding portion P on the base substrate are located on the same side of the orthographic projection of the main body portion Gall of the scan signal line on the base substrate. The length of the first portion 3411 in the second direction X is larger than the length of the protruding portion P in the second direction X. Here, in the second direction X, the orthographic projection of the main body portion Gall of the scan signal line on the base substrate includes two opposite sides (for example, the upper side and the lower side), and the orthographic projection of the first portion 3411 on the base substrate and the orthographic projection of the protruding portion P on the base substrate being located on the same side of the orthographic projection of the main body portion Gall of the scan signal line on the base substrate refers to that both the orthographic projection of the first portion 3411 on the base substrate and the orthographic projection of the protruding portion P on the base substrate being located on the upper side, or the lower side of the orthographic projection of the main body portion Gall of the scan signal line on the base substrate. In the illustrated embodiment, the orthographic projection of the first portion 3411 on the base substrate and the orthographic projection of the protruding portion P on the base substrate are both located on the upper side of the orthographic projection of the main portion Gall of the scan signal line on the base substrate. Such arrangement can facilitate connecting the end of the first portion 3411 to the gate electrode of the driving transistor T1.

Further, the size of the connection structure 341 in the second direction X ranges from 35 μm to 70 μm. Scuh arrangement ensures that both ends of the connection structure 341 are electrically connected to the gate electrode of the driving transistor T1 in the first conductive layer 320 and the source and drain regions of the threshold compensation transistor T3 in the active semiconductor layer 310 respectively. In some embodiments, the size of the connection structure 341 in the second direction X is 35 μm, 40 μm, 45 μm, 50 μm, 55 μm, 60 μm, 65 μm, 70 μm, and so on.

In one embodiment, as shown in FIG. 7 and FIG. 10, the orthographic projection of the first electrode 12 of at least one of the second color sub-pixels on the base substrate has overlap with the orthographic projection of the reset control signal line Rst1 on the base substrate and the orthographic projection of the scan signal line Ga1 on the base substrate overlap. In some embodiments, the orthographic projection of the first electrode 12 of each second color sub-pixel of the display panel on the base substrate has overlap with the orthographic projection of one reset control signal line Rst1 on the base substrate and the orthographic projection of one scan signal line Ga1 on the base substrate. Such arrangement helps to increase the pixel density of the display substrate.

In one embodiment, the size of the first color sub-pixel in the first direction Y ranges from 35 μm to 110 μm, and the size of the first color sub-pixel in the second direction X ranges from 20 μm to 60 μm. The size of the second color sub-pixel in the first direction Y ranges from 35 μm to 120 μm, and the size of the second color sub-pixel in the second direction X ranges from 20 μm to 80 μm. The size of the third color sub-pixel in the first direction in Y ranges from 35 μm to 70 μm, and the size of the third color sub-pixel in the second direction X ranges from 20 μm to 60 μm. The size of the sub-pixel in the first direction refers to its maximum size in the first direction Y, and the maximum size of the sub-pixel in the first direction Y refers to the maximum size of an overlapping part of the orthographic projection of the pixel opening of the sub-pixel on the base substrate and the orthographic projection of the first electrode on the base substrate in the first direction Y. The size of the sub-pixel in the first direction X refers to its maximum size in the second direction X. The maximum size of the sub-pixel in the second direction X refers to the maximum size of an overlapping part of the orthographic projection of the pixel opening of the sub-pixel on the base substrate and the orthographic projection of the first electrode on the base substrate in the second direction X.

In some examples, the size of the first color sub-pixel in the first direction Y is, for example, 35 μm, 45 μm, 55 μm, 65 μm, 75 μm, 85 μm, 95 μm, 105 μm, 110 μm, and so on. The size of the first color sub-pixel in the second direction X is, for example, 20 μm, 25 μm, 30 μm, 35 μm, 40 μm, 45 μm, 50 μm, 55 μm, 60 μm, and so on. The size of the second color sub-pixel in the first direction Y is, for example, 35 μm, 45 μm, 55 μm, 65 μm, 75 μm, 85 μm, 95 μm, 105 μm, 115 μm, 120 μm, and so on. The size of the second color sub-pixel in the second direction X is, for example, 20 μm, 30 μm, 40 μm, 50 μm, 60 μm, 70 μm, 80 μm, and so on. The size of the third color sub-pixel in the first direction Y is 35 μm, 40 μm, 45 μm, 50 μm, 55 μm, 60 μm, 65 μm, 70 μm. The size of the third color sub-pixel in the second direction X is, for example, 20 μm, 25 μm, 30 μm, 35 μm, 40 μm, 45 μm, 50 μm, 55 μm, 60 μm, and so on.

Further, the area of the second color sub-pixel is larger than the area of the first color sub-pixel, and the area of the first color sub-pixel is larger than the area of the third color sub-pixel. Such arrangement can reduce the difference in the lifetimes of the sub-pixels of each color.

The embodiment of the present application also provides another new pixel arrangement. Referring to FIGS. 12 to 16, the orthographic projection of the pixel opening of at least one sub-pixel on the base substrate has overlap with the orthographic projection of the channel of its driving transistor on the base substrate, and the orthographic projection of the pixel opening 22 of at least one of the second color sub-pixels in the first direction has overlap with the orthographic projection of the pixel opening 21 of the first color sub-pixel in the first direction Y and the orthographic projection of the pixel opening 23 of the third color sub-pixel in the first direction Y, and the orthographic projection of the pixel opening 22 of at least one of the second color sub-pixels in the second direction X has no overlap with either the orthographic projection of the pixel opening 21 of the first color sub-pixel in the second direction X or the orthographic projection of the pixel opening 23 of the third color sub-pixel in the second direction X, where the first direction Y intersects with the second direction X. The pixel arrangement provided by the embodiments of the present application is different from the pixel arrangement in the display panel existing in the art.

The orthographic projection of the pixel opening on the first direction Y refers to the orthographic projection of the pixel opening on a straight line extending along the first direction Y.

Figure 16:
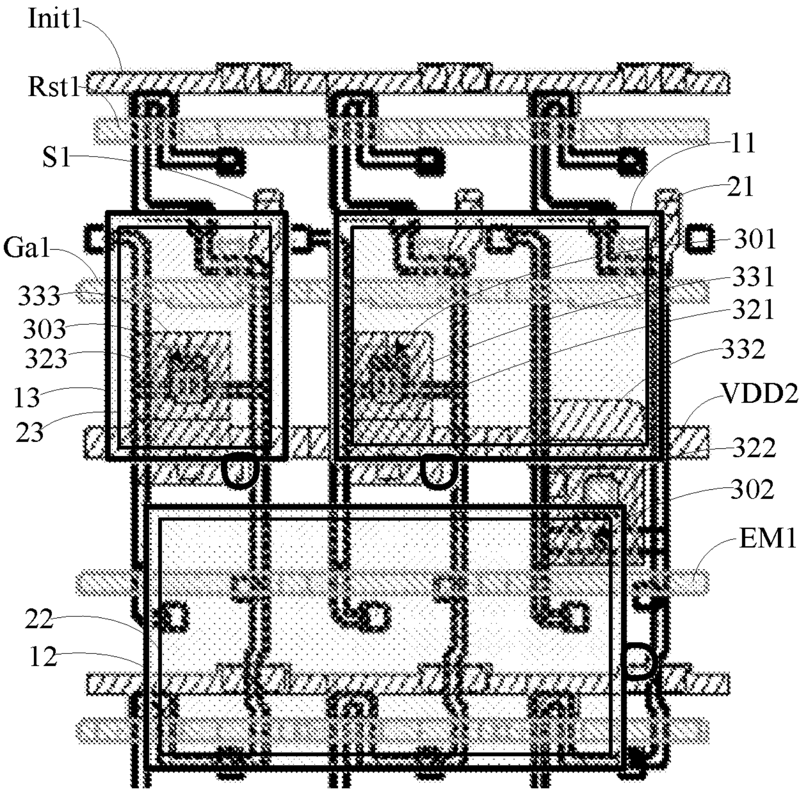

In one embodiment, as shown in FIG. 16, the orthographic projection of the pixel opening 21 of the first color sub-pixel on the base substrate has overlap with the orthographic projection of the channel 301 of the driving transistor thereof on the base substrate, the orthographic projection of the pixel opening 23 of the third color sub-pixel on the base substrate has overlap with the orthographic projection of the channel 303 of the driving transistor thereof on the base substrate, and the orthographic projection of the pixel opening 22 of the second color sub-pixel on the base substrate has overlap with the orthographic projection of the channel 302 of the driving transistor thereof on the base substrate.

Further, as shown in FIG. 16, the orthographic projection of the channel 301 of the driving transistor of the first color sub-pixel on the base substrate falls within the orthographic projection of the pixel opening 21 on the base substrate, the orthographic projection of the channel 302 of the driving transistor of the second color sub-pixel on the base substrate falls within the orthographic projection of the pixel opening 22 on the base substrate, and the orthographic projection of the channel 303 of the driving transistor of the third color sub-pixel on the base substrate falls within the orthographic projection of the pixel opening 23 on the base substrate.

In other embodiments, in the first color sub-pixel, the second color sub-pixel and the third color sub-pixel, only orthographic projections of the pixel openings of the sub-pixels of one color or the sub-pixels of two colors on the base substrate have overlap with the orthographic projection of the channel of the driving transistor thereof on the base substrate.

In one embodiment, as shown in FIG. 16, the orthographic projection of the pixel opening 21 of the first color sub-pixel on the base substrate has no overlap with either the orthographic projection of the channel 302 of the driving transistor of the second color sub-pixel on the base substrate or the orthographic projection of the channel 303 of the driving transistor of the third color sub-pixel on the base substrate. The orthographic projection of the pixel opening 22 of the second color sub-pixel on the base substrate has no overlap with either the orthographic projection of the channel 301 of the driving transistor of the first color sub-pixel on the base substrate or the orthographic projection of the channel 303 of the driving transistor of the third color sub-pixel on the base substrate. The orthographic projection of the pixel opening 23 of the third color sub-pixel on the base substrate has no overlap with either the orthographic projection of the channel 301 of the driving transistor of the first color sub-pixel on the base substrate or the orthographic projection of the channel 302 of the driving transistor of the second color sub-pixel on the base substrate. In such arrangement, the orthographic projection of the channel of the driving transistor of each sub-pixel on the base substrate only has overlap with the orthographic projection of its pixel opening on the base substrate, and has no overlap with the orthographic projection of the pixel opening of other sub-pixels on the base substrate. This is more helpful to reduce the difference in the luminance decay speed of the organic light emitting elements of each sub-pixel, thereby alleviating the color shift problem of the display substrate.

In another embodiment of the present application, the orthographic projection of the channel of the driving transistor of the first color sub-pixel on the base substrate and the orthographic projection of the channel of the driving transistor of the second color sub-pixel on the base substrate are located within the orthographic projection of the pixel opening corresponding to the second color sub-pixel on the base substrate. The orthographic projection of the channel of the driving transistor of the third color on the base substrate is located within the orthographic projection of the pixel opening corresponding to the third color sub-pixel on the base substrate. Such arrangement can prevent the driving transistor of the second color sub-pixel with a larger driving current from increasing the temperature of the organic light emitting element of the first color sub-pixel too much, which otherwise would cause an excessively fast luminance decay rate and a shortened life of the first color sub-pixel. The problem can be avoided that the luminance decay speed of the first color sub-pixel is significantly different from the luminance decay speed of the second color sub-pixel and the third color sub-pixel, and the color shift phenomenon of the display substrate can be alleviated.

In yet another embodiment of the present application, the orthographic projection of the channel of the driving transistor of the second color sub-pixel on the base substrate has no overlap with the orthographic projection of the pixel opening corresponding to the first color sub-pixel on the base substrate, the orthographic projection of the pixel opening corresponding to the second color sub-pixel on the base substrate, and the orthographic projection of the pixel opening corresponding to the third color sub-pixel on the base substrate. In such arrangement, the driving transistors of the second color sub-pixels with larger driving currents have less influence on the organic light emitting elements of the respective color sub-pixels, which is more helpful to improve the service life of the display substrate and alleviate the color shift problem of the display substrate.

Further, the orthographic projection of the channel of the driving transistor of the first color sub-pixel on the base substrate and the orthographic projection of the channel of the driving transistor of the third color on the base substrate are both located within the orthographic projection of the pixel opening corresponding to the second color sub-pixel on the base substrate. Alternatively, the orthographic projection of the channel of the driving transistor of the first color sub-pixel on the base substrate is located within the orthographic projection of the pixel opening corresponding to the second color sub-pixel on the base substrate, and the orthographic projection of the channel of the driving transistor of the third color on the base substrate is located within the orthographic projection of the pixel opening corresponding to the third color sub-pixel on the base substrate.

In one embodiment, the plurality of sub-pixels are divided into a plurality of pixel groups, each of the pixel groups including a first color sub-pixel, a second color sub-pixel and a third color sub-pixel. At least one of the pixel groups includes two rows of sub-pixels arranged along the first direction, wherein one row of sub-pixels arranged along the first direction includes first color sub-pixels and third color sub-pixels which are alternately arranged, and the other row of sub-pixels arranged along the first direction includes second color sub-pixels.

In one embodiment, as shown in FIG. 16, in at least one pixel group, in the second direction X, the distance from the channel 302 of the driving transistor of the second color sub-pixel to the scan signal line Ga1 is different from the distance from the channel 301 of the driving transistor of the first color sub-pixel to the scan signal line Ga1. Further, in the second direction X, the distance from the channel 303 of the driving transistor of the third color sub-pixel to the scan signal line Ga1 is approximately equal to the distance from the channel 301 of the driving transistor of the first color sub-pixel to the scan signal line Ga1. Such arrangement is more helpful to avoid overlap between the orthographic projections of the channel 302 of the driving transistor of the second color sub-pixel and of the pixel opening of the first color sub-pixel on the base substrate.

Further, in at least one pixel group, in the second direction X, the distance from the channel 302 of the driving transistor of the second color sub-pixel to the scan signal line Ga1 is longer than the distance from the channel 301 of the driving transistor of the first color sub-pixel to the scan signal line Ga1. Such arrangement is more helpful to avoid the problem that the heat generated by the driving transistor of the second color sub-pixel causes the brightness of the second color sub-pixel to attenuate too quickly and the life span to be shortened.

Further, in at least one pixel group, in the second direction X, the distance from the channel 302 of the driving transistor of the second color sub-pixel to the scan signal line Ga1 ranges from 1 μm to 60 μm, the distance from the channel 301 of the driving transistor of the first color sub-pixel to the scan signal line Ga1 ranges from 1 μm to 50 μm, and the distance from the channel 301 of the driving transistor of the third color sub-pixel to the scan signal line Ga1 ranges from 1 μm to 50 μm. In the second direction X, the distance from the channel 302 of the driving transistor of the second color sub-pixel to the scan signal line Ga1 is, for example, 1 μm, 10 μm, 20 μm, 30 μm, 40 μm, 50 μm, 60 μm, and the distance from the channel 301 of the driving transistor of the first color sub-pixel to the scan signal line Ga1 and the distance from the channel 301 of the driving transistor of the third color sub-pixel to the scan signal line Ga1 are, for example, 1 μm, 10 μm, 20 μm, 30 μm, 40 μm, 50 μm, and so on.

Figure 13:
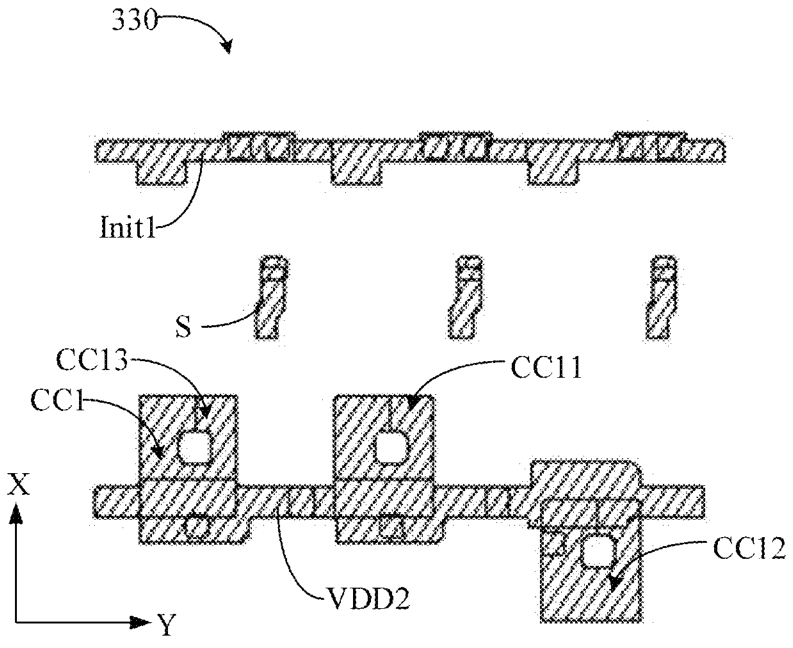

In one embodiment, referring to FIG. 13, the area of the second polar plate CC12 of the second color sub-pixel is larger than the area of the second polar plate CC11 of the first color sub-pixel, the area of the second polar plate CC12 of the second color sub-pixel is larger than the area of the second polar plate CC13 of the third color sub-pixel. Generally, a width to length ratio of the channel of the driving transistor of the second color sub-pixel is larger than a width to length ratio of the channel of the driving transistor of the first color sub-pixel or of the second color sub-pixel, so as to prevent the phenomenon of insufficient brightness of the second color when the display substrate displays white light at the highest gray level, which would otherwise cause the white balance color coordinate of the white light of the highest gray level to shift from the design value. By setting the area of the second polar plate CC12 of the second color sub-pixel larger than the area of the second polar plate CC11 of the first color sub-pixel and the second polar plate CC13 of the third color sub-pixel, the second polar plate CC12 of the second color sub-pixel can cover the channel of driving transistor.

In one embodiment, the areas of the electrode connection structures are different for at least two of the sub-pixels.

Figure 14:
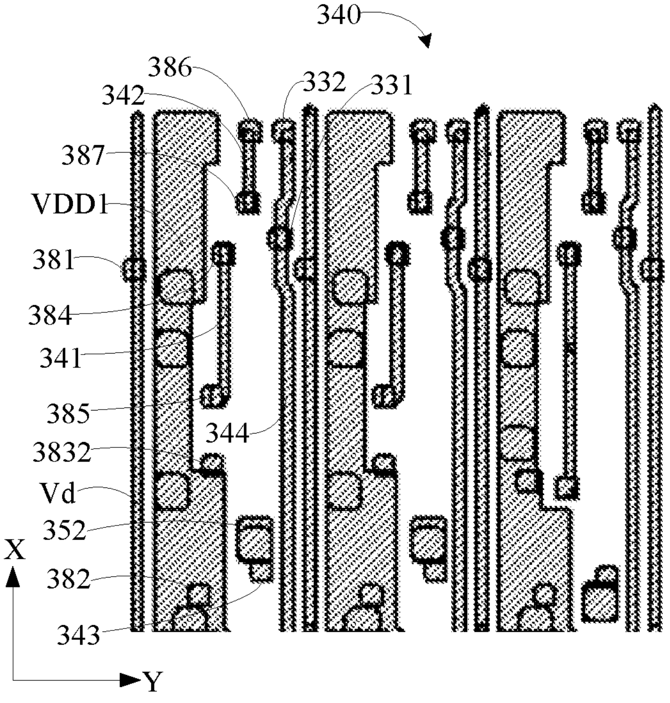
Figure 15:
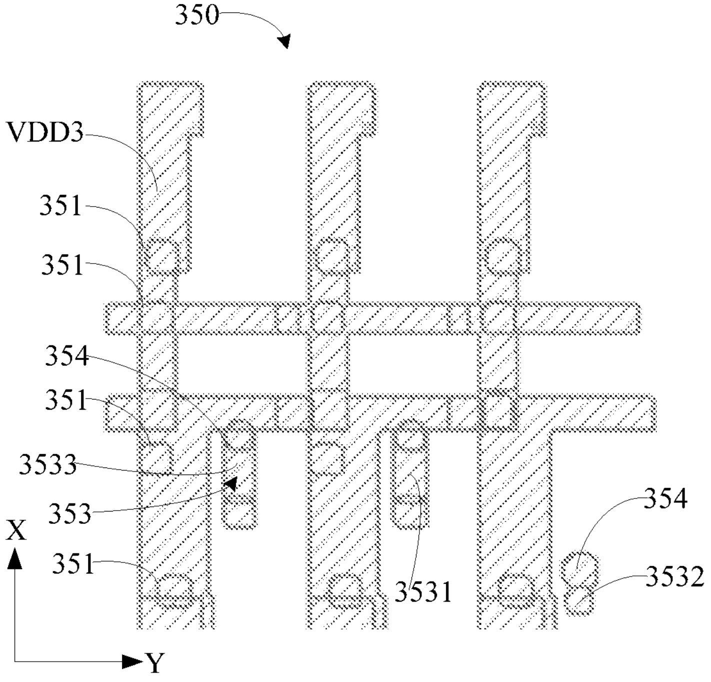

Further, referring to FIG. 14 and FIG. 15, the electrode connection structure includes a first electrode connection sub-structure 343 and a second electrode connection sub-structure 353. The areas of the first electrode connection sub-structure 343 and/or the second electrode connection sub-structure 353 are different for at least two of the sub-pixels.

Further, as shown in FIG. 15, the area of the second electrode connection sub-structure 3532 of the second color sub-pixel is smaller than the area of the second electrode connection sub-structure 3531 of the first color sub-pixel, and the area of the second electrode connection sub-structure 3532 of the second color sub-pixel is smaller than the area of the second electrode connection sub-structure 3533 of the third color sub-pixel.

In one embodiment, referring to FIG. 16, the orthographic projection of the first electrode 12 of at least one of the second color sub-pixels on the base substrate has overlap with the orthographic projection of the reset control signal line Rst1 on the base substrate and the orthographic projection of the scan signal line Ga1 on the base substrate.

In one embodiment, the connection structure 341 includes a first portion and a second portion connected to the first portion, the orthographic projection of the first portion on the base substrate and the orthographic projection of the protruding part P on the base substrate are located on the same side of the orthographic projection of the main portion Gall of the scan signal line on the base substrate. The length of the first portion in the second direction X is larger than the length of the protruding portion P in the second direction X. Such arrangement facilitates connecting the end of the first portion is connected to the gate electrode of the driving transistor T1.

Further, the size of the connection structure 341 in the second direction X ranges from 35 μm to 70 μm. Such arrangement ensures electrical connection the two ends of the connection structure 341 to the gate electrode of the driving transistor T1 in the first conductive layer 320 and the source and drain regions of the threshold compensation transistor T3 in the active semiconductor layer 310 respectively. In some embodiments, the size of the connection structure 341 in the second direction X is 35 μm, 40 μm, 45 μm, 50 μm, 55 μm, 60 μm, 65 μm, 70 μm, and so on.

In one embodiment, the size of the first color sub-pixel in the first direction Y ranges from 35 μm to 110 μm, and the size of the first color sub-pixel in the second direction X ranges from 20 μm to 60 μm; the size of the second color sub-pixel in the first direction Y ranges from 35 μm to 120 μm, and the size of the second color sub-pixel in the second direction X ranges from 20 μm to 80 μm; the size of the third color sub-pixel in the first direction Y ranges from 35 μm to 70 μm, and the size of the third color sub-pixel in the second direction X ranges from 20 μm to 60 μm. The size of the sub-pixel in the first direction refers to its maximum size in the first direction Y, and the maximum size of the sub-pixel in the first direction Y refers to the maximum size of an overlapping part of the orthographic projection of the pixel opening of the sub-pixel on the base substrate and the orthographic projection of the first electrode on the base substrate in the first direction Y. The maximum size of the sub-pixel in the second direction X refers to the maximum size of an overlapping part of the orthographic projection of the pixel opening of the sub-pixel on the base substrate and the orthographic projection of the first electrode on the base substrate in the second direction X.

In some examples, the size of the first color sub-pixel in the first direction Y is, for example, 35 μm, 45 μm, 55 μm, 65 μm, 75 μm, 85 μm, 95 μm, 105 μm, 110 μm, and so on. The size of the first color sub-pixel in the second direction X is, for example, 20 μm, 25 μm, 30 μm, 35 μm, 40 μm, 45 μm, 50 μm, 55 μm, 60 μm, and so on. The size of the second color sub-pixel in the first direction Y is, for example, 35 μm, 45 μm, 55 μm, 65 μm, 75 μm, 85 μm, 95 μm, 105 μm, 115 μm, 120 μm, and so on. The size of the second color sub-pixel in the second direction X is, for example, 20 μm, 30 μm, 40 μm, 50 μm, 60 μm, 70 μm, 80 μm, and so on. The size of the third color sub-pixel in the first direction Y is 35 μm, 40 μm, 45 μm, 50 μm, 55 μm, 60 μm, 65 μm, 70 μm. The size of the third color sub-pixel in the second direction X is, for example, 20 μm, 25 μm, 30 μm, 35 μm, 40 μm, 45 μm, 50 μm, 55 μm, 60 μm, and so on.

It should be noted that the features described in different embodiments of the present application can complement each other without conflict. For example, in the case of no conflict, the features in the embodiments shown in FIGS. 2 to 10 can also have the same features in the embodiment shown in FIG. 11 and the embodiments shown in FIGS. 12 to 16. The features of the embodiment shown in FIG. 12 to FIG. 16 can also have the same features in the embodiment shown in FIG. 2 to FIG. 10.

An embodiment of the present application further provides a display panel, where the display panel includes the display substrate described in any of the foregoing embodiments.

The display panel can further include a glass cover plate on the side of the display substrate away from the base substrate.

An embodiment of the present application further provides a display device, and the display device includes the above-mentioned display panel. The display device can further include a housing in which the display panel can be embedded.

The display device in this embodiment can be any product or component with display function, such as an electronic paper, a mobile phone, a tablet computer, a television, a notebook computer, a digital photo frame, a vehicle display device, and so on.

It should be noted that, in the drawings, the sizes of layers and regions can be exaggerated for clarity of illustration. It will also be understood that when an element or layer is referred to as being "on" another element or layer, it can be directly on the other element or intervening layers can be present. In addition, it will be understood that when an element or layer is referred to as being "under" another element or layer, it can be directly under the other element, or more than one intervening layer or element can be present. In addition, it will also be understood that when a layer or element is referred to as being 'between' two layers or elements, it can be the only layer between the two layers or elements, or more than one intervening layer or element can also be present. Like reference numerals indicate like elements throughout.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes can be made without departing from the scope thereof. The scope of the present disclosure is limited only by the appended claims.

The invention claimed is:

1. A display substrate comprising a base substrate and a plurality of sub-pixels disposed on the base substrate;

wherein the plurality of sub-pixels comprises a plurality of first color sub-pixels, a plurality of second color sub-pixels and a plurality of third color sub-pixels, human eyes are more sensitive to a first color of light emitted from the first color sub-pixels than to a third color of light emitted from the third color sub-pixels, and the human eyes are more sensitive to the third color than to a second color of light emitted from the second color sub-pixels; each of the sub-pixels comprises an organic light emitting element and a pixel circuit for driving the organic light emitting element; the organic light emitting element comprises a first electrode, a second electrode, and an organic light emitting material disposed between the first electrode and the second electrode; the first electrode of the sub-pixel is electrically connected to the pixel circuit; the pixel circuit comprises a driving transistor;

the display substrate further comprises an active semiconductor layer and a pixel defining layer, the active semiconductor layer comprises channels and source and drain regions of the driving transistors of the sub-pixels; the pixel defining layer is provided with pixel openings corresponding to the sub-pixels one to one, wherein the plurality of sub-pixels are divided into a plurality of pixel groups, and each of the pixel groups comprises a first color sub-pixel, a second color sub-pixel and a third color sub-pixel; each of at least one of the pixel groups comprises two rows of sub-pixels arranged along a first direction, wherein one row of the two rows of sub-pixels arranged along the first direction comprises the first color sub-pixel and the third color sub-pixel, and the other row of the two rows of sub-pixels arranged along the first direction comprises the second color sub-pixel, wherein an orthographic projection of a pixel opening of the first color sub-pixel on the base substrate has no overlap with an orthographic projection of a channel of a driving transistor of the first color sub-pixel on the base substrate, an orthographic projection of a pixel opening of the second color sub-pixel on the base substrate has no overlap with an orthographic projection of a channel of a driving transistor of the second color sub-pixel on the base substrate, and an orthographic projection of a pixel opening of the third color sub-pixel on the base substrate has no overlap with an orthographic projection of a channel of a driving transistor of the third color sub-pixel on the base substrate, wherein in each of the at least one of the pixel groups, an orthographic projection of the pixel opening of the second color sub-pixel on a dummy straight line extending along the first direction has overlap with an orthographic projection of the pixel opening of the first color sub-pixel on the dummy straight line extending along the first direction and an orthographic projection of the pixel opening of the third color sub-pixel on the dummy straight line extending along the first direction, and an orthographic projection of the pixel opening of the second color sub-pixel on a dummy straight line extending along a second direction has no overlap with either an orthographic projection of the pixel opening of the first color sub-pixel on the dummy straight line extending along the second direction or an orthographic projection of the pixel opening of the third color sub-pixel on the dummy straight line extending along the second direction, wherein the first direction is perpendicular to the second direction, and wherein a size of the pixel opening of the second color sub-pixel along the first direction is greater than a size of the pixel opening of the first color sub-pixel along the first direction and a size of the pixel opening of the third color sub-pixel along the first direction.

2. The display substrate according to claim 1, wherein, in at least one of the pixel groups, an orthographic projection of a pixel opening corresponding to each of the sub-pixels on the base substrate has no overlap with an orthographic projection of a gate electrode of a driving transistor of any one of the sub-pixels on the base substrate, or the orthographic projection of the pixel opening corresponding to each of the sub-pixels on the base substrate has an overlapping region with the orthographic projection of the gate electrode of the driving transistor of any one of the sub-pixels on the base substrate, and a ratio of an area of the overlapping region to an area of the gate electrode is not more than 10%.

3. The display substrate according to claim 1, wherein the display substrate is further provided with scan signal lines extending along the first direction, the scan signal lines being configured to provide scan signals for the pixel groups;

in at least one of the pixel groups, an orthographic projection of a corresponding scan signal line of the scan signal lines on a dummy straight line extending along the second direction has overlap with an orthographic projection of a gate electrode of the driving transistor of at least one of the sub-pixels on the dummy straight line extending along the second direction, where the second direction is perpendicular to the first direction.

4. The display substrate according to claim 1, wherein the display substrate is further provided with scan signal lines extending along the first direction, the scan signal lines being configured to provide scan signals for the pixel groups; each of at least one of the scan signal lines comprises a main body portion and a protruding portion protruding from one side of the main body portion of the scan signal line; the main body portion of the scan signal line comprises a first scan sub-line, a second scan sub-line and a connection part, the first scan sub-line is connected to the second scan sub-line through the connection part, the first scan sub-line is connected to a pixel circuit of the first color sub-pixel, the second scan sub-line is connected to a pixel circuit of the second color sub-pixel, and an extension direction of part of the connection part intersects with an extension direction of the first scan sub-line;

the pixel circuit further comprises a compensation transistor, and the compensation transistor comprises a first gate electrode and a second gate electrode; in the compensation transistor, the first gate electrode is a part of the connection part that overlaps with an orthographic projection of the active semiconductor layer on the base substrate, and the second gate electrode is a part of the protruding portion that overlaps the orthographic projection of the active semiconductor layer on the base substrate.

5. The display substrate according to claim 4, wherein the connection part comprises a first connection sub-part, a second connection sub-part and a third connection sub-part which are connected in sequence, extension directions of the first connection sub-part and the third connection sub-part intersect with the extension direction of the first scan sub-line, and an extension direction of the second connection sub-part is the same as the extension direction of the first scan sub-line;

the first gate electrode is a part of the second connection sub-part that overlaps with the orthographic projection of the active semiconductor layer on the base substrate, wherein the first connection sub-part comprises a first end connected to the first scan sub-line and a second end connected to the second connection sub-part, the third connection sub-part comprises a third end connected to the second scan sub-line and a fourth end connected to the second connection sub-part, wherein the first end and the third end are separated from each other by a predetermined distance in the first direction.

6. The display substrate according to claim 4, wherein the active semiconductor layer comprises a first section, a second section, a third section and a fourth section which are connected in sequence; the second section, the fourth section and the main body portion of the scan signal line extend along the first direction, the first section and the third section extend in the second direction; the display substrate further comprises a reset control signal line extending along the first direction and disposed in the same layer as the scan signal line; the pixel circuit further comprises a reset transistor, and the reset transistor comprises a gate electrode;

the second gate electrode is a part of the protruding portion that overlaps with an orthographic projection of the fourth section on the base substrate, the gate electrode of the reset transistor comprises a part of the reset control signal line that overlaps with an orthographic projection of the first section on the base substrate.

7. The display substrate according to claim 4, wherein the pixel circuit further comprises a threshold compensation transistor, the threshold compensation transistor comprises a gate electrode; the display substrate further comprises a connection structure, one end of the connection structure is connected to a gate electrode of the driving transistor, and the other end of the connection structure is connected to source and drain regions of the threshold compensation transistor;

the connection structure comprises a first portion and a second portion connected to the first portion, an orthographic projection of the first portion on the base substrate and an orthographic projection of the protruding portion on the base substrate are disposed at the same side of an orthographic projection of the main body portion of the scan signal line on the base substrate; a length of the first portion in the second direction is larger than a length of the protruding portion in the second direction.

8. The display substrate according to claim 7, wherein a size of the connection structure in the second direction ranges from 35 μm to 70 μm.

9. The display substrate according to claim 1, wherein the display substrate is further provided with a plurality of scan signal lines and a plurality of reset control signal lines extending along the first direction, the scan signal lines being configured to provide scan signals for the pixel groups, the reset control signal lines being configured to provide reset control signals for the pixel groups;

an orthographic projection of a first electrode of at least one of the second color sub-pixels on the base substrate has overlap with an orthographic projection of a corresponding reset control signal line of the reset control signal lines on the base substrate and an orthographic projection of a corresponding scan signal line of the scan signal lines on the base substrate.

10. The display substrate according to claim 1, wherein any one of the orthographic projection of the pixel opening of the first color sub-pixel on the base substrate, the orthographic projection of the pixel opening of the second color sub-pixel on the base substrate or the orthographic projection of the pixel opening of the third color sub-pixel on the base substrate has no overlap with any one of the orthographic projection of the channel of the driving transistor of the first color sub-pixel on the base substrate, the orthographic projection of the channel of the driving transistor of the second color sub-pixel on the base substrate, or the orthographic projection of the channel of the driving transistor of the third color sub-pixel on the base substrate.

11. The display substrate according to claim 10, wherein the display substrate is further provided with scan signal lines, the scan signal lines being configured to provide scan signals for the pixel groups; a distance between the channel of the driving transistor of at least one of the sub-pixels and a corresponding scan signal line of the scan signal lines in the second direction ranges from 1 μm to 50 μm.

12. The display substrate according to claim 1, wherein the pixel circuit further comprises a capacitor, and the capacitor comprises a first polar plate and a second polar plate disposed on a side of the first polar plate away from the base substrate; in at least one of the pixel groups, an area of a second polar plate of the second color sub-pixel is larger than an area of a second polar plate of the first color sub-pixel, and the area of the second polar plate of the second color sub-pixel is larger than an area of a second polar plate of the third color sub-pixel.

13. The display substrate according to claim 1, wherein the display substrate further comprises a first power supply line and a second power supply line disposed on a side of the first power supply line away from the base substrate; the first power supply line and the second power supply line are configured to provide a power supply signal for the pixel circuit; the first power supply line is electrically connected to the second power supply line;

the second power supply line comprises a first power supply sub-line extending along the first direction and a second power supply sub-line extending along the second direction, the first power supply sub-line intersecting with the second power supply sub-line.

14. A display panel, comprising the display substrate according to claim 1.

15. A display device, comprising the display panel according to claim 14.

16. A display substrate comprising a base substrate and a plurality of sub-pixels disposed on the base substrate;

wherein the plurality of sub-pixels comprises a plurality of first color sub-pixels, a plurality of second color sub-pixels and a plurality of third color sub-pixels, human eyes are more sensitive to a first color of light emitted from the first color sub-pixels than to a third color of light emitted from the third color sub-pixels, and the human eyes are more sensitive to the third color than to a second color of light emitted from the second color sub-pixels; each of the sub-pixels comprises an organic light emitting element and a pixel circuit for driving the organic light emitting element; the organic light emitting element comprises a first electrode, a second electrode, and an organic light emitting material disposed between the first electrode and the second electrode; the first electrode of the sub-pixel is electrically connected to the pixel circuit; the pixel circuit comprises a driving transistor;

the display substrate further comprises an active semiconductor layer and a pixel defining layer, the active semiconductor layer comprises channels and source and drain regions of the driving transistors of the sub-pixels; the pixel defining layer is provided with pixel openings corresponding to the sub-pixels one to one, wherein the plurality of sub-pixels are divided into a plurality of pixel groups, and each of the pixel groups comprises a first color sub-pixel, a second color sub-pixel and a third color sub-pixel; each of at least one of the pixel groups comprises two rows of sub-pixels arranged along a first direction, wherein one row of the two rows of sub-pixels arranged along the first direction comprises the first color sub-pixel and the third color sub-pixel, and the other row of the two rows of sub-pixels arranged along the first direction comprises the second color sub-pixel, wherein an orthographic projection of a pixel opening of at least one of the sub-pixels on the base substrate has overlap with an orthographic projection of a channel of a driving transistor thereof on the base substrate, and wherein in each of the at least one of the pixel groups, an orthographic projection of a pixel opening of the second color sub-pixel on a dummy straight line extending along the first direction has overlap with an orthographic projection of a pixel opening of the first color sub-pixel on the dummy straight line extending along the first direction and an orthographic projection of a pixel opening of the third color sub-pixel on the dummy straight line extending along the first direction, and an orthographic projection of the pixel opening of the second color sub-pixel on a dummy straight line extending along a second direction has no overlap with either an orthographic projection of the pixel opening of the first color sub-pixel on the dummy straight line extending along the second direction or an orthographic projection of the pixel opening of the third color sub-pixel on the dummy straight line extending along the second direction, wherein the first direction is perpendicular to the second direction, wherein a size of the pixel opening of the second color sub-pixel along the first direction is greater than a size of the pixel opening of the first color sub-pixel along the first direction and a size of the pixel opening of the third color sub-pixel along the first direction.

17. The display substrate according to claim 16, wherein an orthographic projection of the pixel opening of the first color sub-pixel on the base substrate has overlap with an orthographic projection of a channel of a driving transistor of the first color sub-pixel on the base substrate, an orthographic projection of the pixel opening of the second color sub-pixel on the base substrate has overlap with an orthographic projection of a channel of a driving transistor of the second color sub-pixel on the base substrate, and an orthographic projection of the pixel opening of the third color sub-pixel on the base substrate has overlap with an orthographic projection of a channel of a driving transistor of the third color sub-pixel on the base substrate.

18. The display substrate according to claim 16, wherein the display substrate is further provided with a plurality of scan signal lines extending along the first direction, the scan signal lines being configured to provide scan signals for the pixel groups;

in at least one of the pixel groups, in the second direction, a distance from a channel of a driving transistor of the second color sub-pixel to a corresponding scan signal line of the scan signal lines is different from a distance from a channel of a driving transistor of the first color sub-pixel to the corresponding scan signal line.

19. The display substrate according to claim 18, wherein, in at least one of the pixel groups, in the second direction, the distance from the channel of the driving transistor of the second color sub-pixel to the corresponding scan signal line is longer than the distance from the channel of the driving transistor of the first color sub-pixel to the corresponding scan signal line.

20. The display substrate according to claim 16, wherein the pixel circuit further comprises an emission control transistor and an electrode connection structure, and the electrode connection structure electrically connects the first electrode of the sub-pixel to source and drain regions of the emission control transistor;

areas of the electrode connection structures of at least two of the sub-pixels are different, the electrode connection structure at least comprises a first electrode connection sub-structure and a second electrode connection sub-structure on a side of the first electrode connection sub-structure away from the base substrate; areas of the first electrode connection sub-structure and/or the second electrode connection sub-structure of at least two of the sub-pixels are different.

* * * * *